(12) United States Patent
Baik

(10) Patent No.: US 7,344,826 B2
(45) Date of Patent: Mar. 18, 2008

(54) METHOD FOR FORMING A CAPACITOR

(75) Inventor: Ihn-Gee Baik, Sungnam (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 0 days.

(21) Appl. No.: 11/594,073

(22) Filed: Nov. 8, 2006

(65) Prior Publication Data

US 2007/0059648 A1    Mar. 15, 2007

Related U.S. Application Data

(63) Continuation of application No. 10/459,593, filed on Jun. 12, 2003, now Pat. No. 7,135,272.

(30) Foreign Application Priority Data

Jun. 12, 2002  (KR)  .............................. 2002-33027

(51) Int. Cl.
  *H01G 4/28*  (2006.01)
  *H01G 4/06*  (2006.01)
(52) U.S. Cl. ...................... 430/319; 430/318; 430/321; 430/317; 430/311; 361/321.6
(58) Field of Classification Search ...................... None
  See application file for complete search history.

(56) References Cited

U.S. PATENT DOCUMENTS 5,583,069 A     12/1996   Ahn et al.
5,656,536 A     8/1997    Wu
5,716,884 A     2/1998    Hsue et al.
5,733,808 A     3/1998    Tseng
5,807,782 A     9/1998    Koh et al.
5,877,052 A     3/1999    Lin et al.
6,060,353 A     5/2000    Koh
2004/0111693 A1 6/2004    Lin et al.

FOREIGN PATENT DOCUMENTS

KR        2001 0092874       10/2001

*Primary Examiner*—John A. McPherson
*Assistant Examiner*—Daborah Chacko-Davis
(74) *Attorney, Agent, or Firm*—Lee & Morse, P.C.

(57) ABSTRACT

In a method for forming a photoresist pattern, a method for forming a capacitor, and a capacitor manufactured using the same, a light is selectively irradiated onto a selected portion of a photoresist film formed on a substrate. An interfered light generated from the irradiated light is transmitted through other portions of the photoresist film except a ring-shaped portion of the photoresist film having a predetermined width along a boundary of the selected portion. The photoresist film is exposed using the interfered light and the light irradiated onto the selected portion. A cylindrical photoresist pattern having a minute width may be formed through developing the photoresist film. With the cylindrical pattern, the capacitor can be easily formed.

7 Claims, 24 Drawing Sheets

METHOD FOR FORMING A CAPACITOR

CROSS REFERENCE TO RELATED APPLICATION

This is a continuation application based on application Ser. No. 10/459,593, filed Jun. 12, 2003, now U.S. Pat. No. 7,135,272 the entire contents of which is hereby incorporated by reference.

BACKGROUND OF THE INVENTION

1. Field of the Invention

The present invention relates to a method for forming a photoresist pattern, a method for forming a capacitor electrode using the same and a capacitor. More particularly, the present invention relates to a method for forming a ring-type photoresist pattern having an open bottom face and an open upper face, a method for forming a capacitor using the same, and a capacitor manufactured by using the ring-type photoresist pattern.

2. Description of the Related Art

For functionality, semiconductor devices require fast operation and high accumulation capacity. For this purpose, manufacturing technologies for improving integration density, response speed and reliability are being developed.

Dynamic random access memory (DRAM) is widely used as a semiconductor device that can input and output information. A DRAM has a cell region for storing information data in the form of electrons and a peripheral circuit region for transferring information data to or from the cell region. A DRAM device typically includes one access transistor and one storage capacitor.

As the degree of integration of semiconductor devices increases, it becomes difficult to improve the capability of a capacitor because the horizontal area that the capacitor occupies decreases. To increase the storage capability of a capacitor, a method for increasing an efficient area of the capacitor has been developed. According to the method, the structure of a capacitor is varied from a planar structure to a stacked structure or a trench-type structure. A stacked capacitor may be further varied to have a cylindrical structure to increase the effective area of the storage electrode.

Other structures for increasing the capacitance of a capacitor include a stacked capacitor having a crown shape, a stacked capacitor having a pin shape, and a capacitor having hemispherical silicon grains formed on a storage electrode thereof.

However, according to conventional methods for forming capacitors, additional processes may be necessary to vary the structure of a capacitor, thereby complicating the method for manufacturing the capacitor.

To grow the hemispherical silicon grains on the storage electrode of the capacitor mentioned above, a sufficient interval between storage electrodes is necessary to prevent a bridge between the storage electrodes. However, to realize a more highly integrated semiconductor device, a design rule thereof has been reduced, and an interval between storage electrodes of the semiconductor device has become even more miniscule. As a result, there may be a limit for growing hemispherical silicon grains on storage electrodes.

FIGS. 1A to 1D illustrate cross sectional views depicting a conventional method for forming a cylindrical capacitor.

Referring to FIG. 1A, a first insulation film 12 is formed on a semiconductor substrate 10, and a contact plug 14 making contact with the semiconductor substrate 10 is formed at a predetermined portion of the first insulation film 12.

An etch stop film 16 is formed on the first insulation film 12, and a second insulation film 18 is formed on the etch stop film 16.

Referring to FIG. 1B, an opening 20 exposing an upper portion of the contact plug 14 and a portion of the first insulation film 12 is formed by successively etching predetermined portions of the second insulation film 18 and the etch stop film 16 to make a second insulation film pattern 18a and an etch stop film pattern 16a.

A polysilicon film having a uniform thickness is formed on a sidewall and a bottom face of the opening 20, and on an upper face of the second insulation film pattern 18a. A sacrificial layer (not shown) is formed on the polysilicon film to fill the opening 20 having the polysilicon film formed thereon, and an upper portion of the sacrificial layer is planarized by an etch back process to separate the polysilicon film into a storage node. The sacrificial layer is removed to form storage node electrode 22, as shown in FIG. 1C.

Referring to FIG. 1D, a capacitor is completed by forming a dielectric film 24 and a plate electrode 26 on the storage node electrode 22.

In the method described above for manufacturing a cylindrical capacitor, complicated manufacturing processes including a deposition process for the insulation films, an etching process, a deposition process for the polysilicon film, a deposition process for the sacrificial layer, and a separation process for the storage node are performed to form the cylindrical storage node electrode node. Therefore, processing failures may occur during any of the complicated processes, and a productivity of the capacitor may be reduced.

In an attempt to solve the problems mentioned above, a method for forming a semiconductor device using a phase shift mask has been proposed. However, according to the method, the height of a storage node electrode may not be increased because the low structure of the storage node electrode may be unstable. In addition, with the phase shift mask, the phase of light passing through a phase inversion material of the phase shift mask may not be inverted so that the light passing through the phase inversion material has an intensity identical to that of light passing through an open region of the phase shift mask.

SUMMARY OF THE INVENTION

In an effort to solve the problems described above, it is a feature of an embodiment of the present invention to provide a method for forming a cylindrical type photoresist pattern having an open upper face and an open bottom face.

It is a second feature of an embodiment of the present invention to provide a capacitor having a cylindrical storage node electrode.

It is a third feature of an embodiment of the present invention to provide a simplified method for forming an electrode of a capacitor electrode.

In one aspect, according to a method for forming a photoresist pattern of one preferred embodiment of the present invention, a photoresist film is exposed by selectively irradiating a selected portion of the photoresist film formed on a semiconductor substrate with light, wherein a portion of the light that undergoes interference is irradiated onto a portion of the photoresist film other than the selected portion of the photoresist film and a portion of the photoresist film having a predetermined width that borders the selected portion, so that the photoresist film is exposed by both the light irradiated onto the selected portion and the portion of the light that undergoes interference. Then, the exposed photoresist film is developed to form a cylindrical photoresist pattern.

The photoresist film may be exposed by the light irradiated onto the selected portion and a transmitting light irradiated onto the portion of the photoresist film other than the selected portion and the portion bordering the selected portion, the transmitting light having a phase that is the inverse of a phase of the light irradiated onto the selected portion.

An intensity of a transmitting light irradiated onto the portion of the photoresist film other than the selected portion and the portion bordering the selected portion is preferably about 5% to about 50% that of the light irradiated onto the selected portion.

The selected portion may include regularly disposed regions of the photoresist film. A first interfered light generated from the light irradiated onto a first selected portion is superposed with interfered lights generated from the light irradiated onto the selected portions adjacent to the first selected portion to increase an intensity of the light exposing the photoresist film.

A width of a ring-shaped portion generated along the border of the selected portion may be adjusted in accordance with the intensity of the light irradiated onto the selected portion.

Because the photoresist film is exposed using the light irradiated onto the selected portion and the interfered light, a cylindrical photoresist pattern having a minute width can be formed.

According to another feature of an embodiment of the present invention, a capacitor is provided including an insulation film having a contact plug formed on a semiconductor substrate, a cylindrical storage node electrode formed on the insulation film, wherein the storage node electrode makes electrical contact with the contact plug and has an open bottom face, and a dielectric film and a plate electrode successively formed on the storage node electrode. Preferably, a portion of the bottom face of the storage node electrode makes contact with an upper face of the contact plug.

In an effort to provide the second feature of an embodiment of the present invention, a capacitor is provided including an insulation film including a contact plug formed on a semiconductor substrate, a ring-shaped pad polysilicon film pattern electrically connected to the contact plug, a double cylindrical storage node electrode in continuous contact with inner and outer surfaces of the ring-shaped pad polysilicon film pattern, wherein the storage node electrode extends vertically from the inner and outer surfaces of the ring-shaped pad polysilicon film pattern and a dielectric film and a plate electrode formed on the storage node electrode. Preferably, a portion of a bottom face of the ring-shaped pad polysilicon film pattern makes contact with an upper face of the contact plug.

A method for forming an electrode of a capacitor electrode according to another embodiment of the present invention includes forming an insulation film including a contact plug on a semiconductor substrate, forming a conductive film on the insulation film, forming a cylindrical photoresist pattern having an open upper face and an open bottom face on the conductive film, the cylindrical photoresist film masking a portion of the conductive film positioned over the contact plug, and forming a cylindrical conductive film pattern having an open upper face and an open bottom face by etching the conductive film using the photoresist pattern as an etching mask until the insulation film is exposed, wherein the cylindrical conductive film pattern makes electrical contact with the contact plugs.

The cylindrical photoresist pattern is preferably formed by coating a photoresist film on the conductive film, exposing the photoresist film by irradiating a light onto a selected portion of the photoresist film and by transmitting a portion of the light that undergoes interference onto a remaining portion of the photoresist film other than the selected portion and a ring-shaped portion of the photoresist film having a predetermined width bordering the selected portion, wherein a portion of the conductive film corresponding to the contact plug is positioned beneath the ring-shaped portion, and developing the exposed photoresist film to provide the cylindrical pattern.

The photoresist film is preferably exposed by the light irradiated onto the selected portion and a transmitting light irradiated onto the photoresist film other than the selected portion and the ring-shaped portion bordering the selected portion, the transmitting light having a phase that is the inverse of a phase of the light irradiated onto the selected portion.

Preferably, a first interfered light generated from a first light irradiated onto a first selected portion is superposed with interfered light generated from the light irradiated onto the selected portion adjacent to the first selected portion to increase an intensity of the light exposing the photoresist film.

A width of the ring-shaped portion may be adjusted by an intensity of the light irradiated onto the selected portion. An exposed upper portion of the contact plug may be wider than a lower portion of the contact plug.

In accordance with another embodiment of the present invention, a method for forming an electrode of a capacitor includes forming a first insulation film including a contact plug on a semiconductor substrate, forming a first polysilicon film on the first insulation film, forming a second insulation film on the first polysilicon film, forming a cylindrical photoresist pattern having an open upper face and an open bottom face on the second insulation film by masking the second insulation film positioned over the contact plug, forming a cylindrical second insulation film pattern having an open upper face and an open bottom face by etching the second insulation film using the cylindrical photoresist pattern as an etching mask until the first polysilicon film is exposed, continuously forming a second polysilicon film on the exposed first polysilicon film, on a sidewall of the second insulation film pattern, and on the second insulation film pattern, and anisotropically etching the second polysilicon and the first polysilicon films so that polysilicon films partially remain only on inner and outer sidewalls of the second insulation film pattern and on a bottom of the second insulation film pattern.

The cylindrical photoresist pattern is preferably formed by coating a photoresist film on the second insulation film, exposing the photoresist film by irradiating a light onto a selected portion of the photoresist film and by irradiating an interfered light generated from the irradiated light onto a portion of the photoresist film other than the selected portion and a ring-shaped portion of the photoresist film having a predetermined width that borders the selected portion, wherein the second insulation film corresponding to an upper portion of the contact plug is positioned beneath the ring-shaped portion, and developing the exposed photoresist film to provide the pattern.

The photoresist film is preferably exposed by the light irradiated onto the selected portion and a transmitting light irradiated onto the portion of the photoresist film other than the selected portion, the transmitting light having a phase that is the inverse of a phase of the light irradiated onto the selected portion.

Preferably, a first interfered light generated from a first light irradiated onto a first selected portion is superposed with interfered light generated from the light irradiated onto the selected portion adjacent to the first selected portion to increase an intensity of the light exposing the photoresist film.

The first insulation film may be formed by successively forming an oxide film and a nitride film on the semiconductor substrate, forming a contact hole by successively etching portions of the nitride film and the oxide film, filling the contact hole with a conductive material, and etching the conductive material by an etch back process until the nitride film is exposed.

Alternatively, the first insulation film may be formed by successively forming a first oxide film, a nitride film and a second oxide film on the semiconductor substrate, forming a contact hole by successively etching portions of the first oxide film, the nitride film, and the second oxide film, filling the contact hole with a conductive material, and etching the conductive material by an etch back process until the second oxide film is exposed.

According to the present invention, when the storage node electrode of the capacitor is formed, an etching process may be performed using the cylindrical photoresist pattern having the open upper and bottom faces, thereby simplifying the manufacturing process of the capacitor.

BRIEF DESCRIPTION OF THE DRAWINGS

The above features and advantages of the present invention will become more apparent to those of ordinary skill in the art by describing in detail preferred embodiments thereof with reference to the attached drawings in which.

DESCRIPTION OF THE PREFERRED EMBODIMENTS

Korean Patent Application No. 2002-33027, filed on Jun. 12, 2002, and entitled: "Method For Forming A Photoresist Pattern, Method For Forming A Capacitor Using The Same And Capacitor," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

Embodiment 1

Figure 1A:
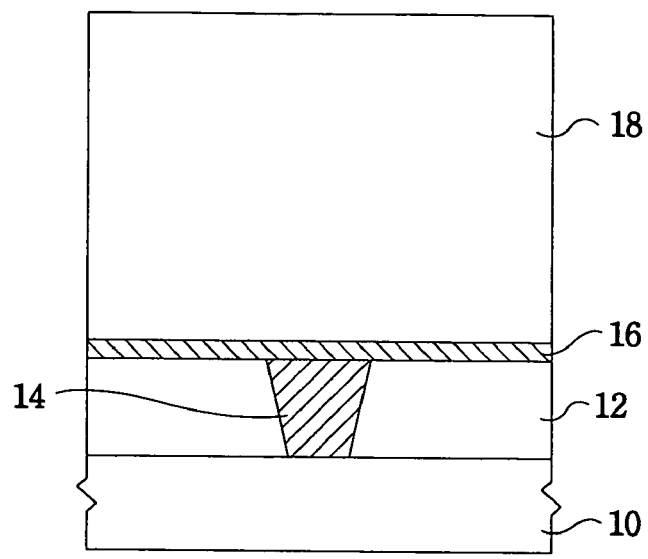
FIGS. 1A to 1D illustrate cross-sectional views depicting a conventional method for forming a cylindrical capacitor.
Figure 1B:
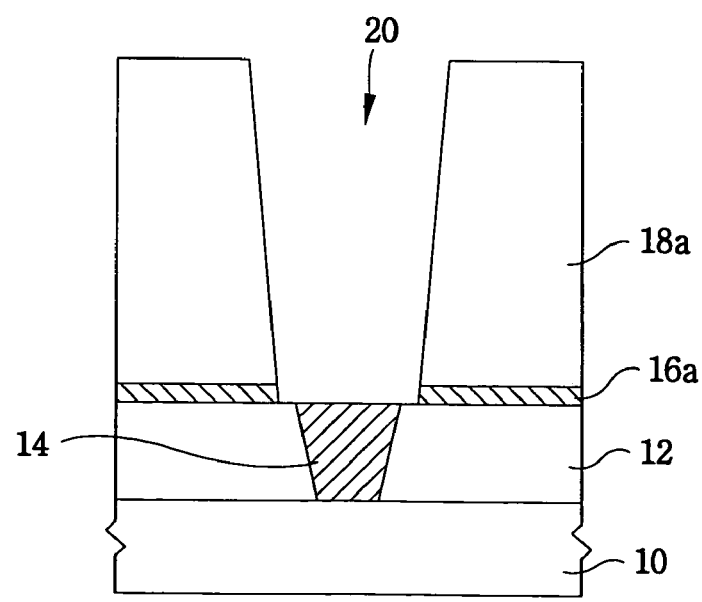
Figure 1C:
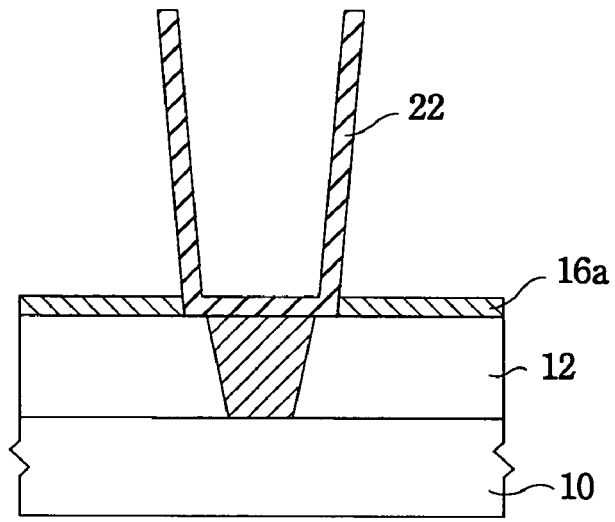
Figure 1D:
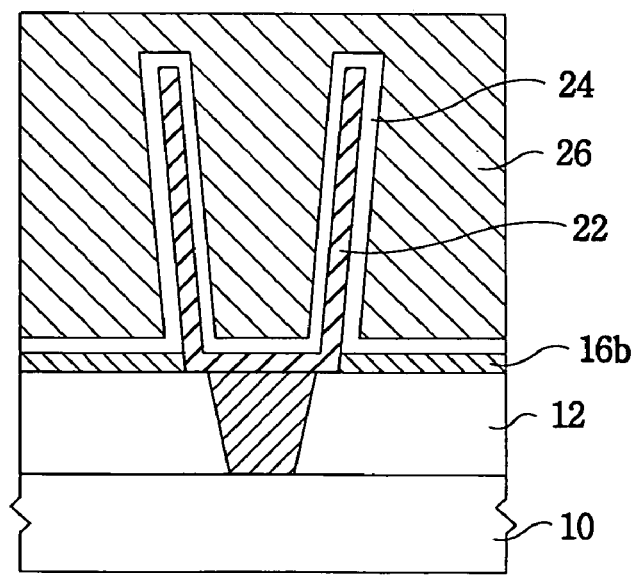
Figure 2:
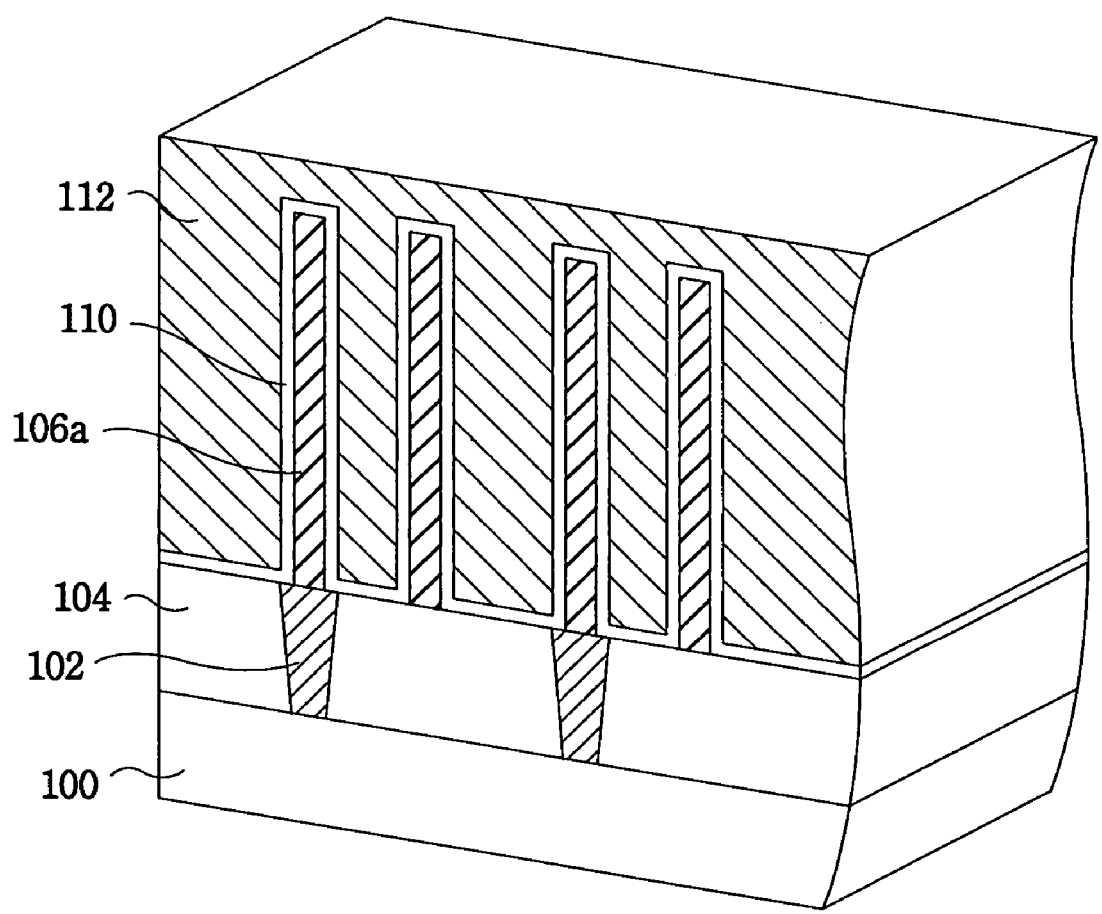
FIG. 2 illustrates a cross-sectional view of a capacitor according to a first embodiment of the present invention.

FIG. 2 illustrates a cross-sectional view of a capacitor according to a first embodiment of the present invention.

Referring to FIG. 2, an insulation film 104 including contact plugs 102 is formed on a semiconductor substrate 100. The contact plugs 102 are electrically connected to a capacitor node contact region (for example, a source region of a transistor) of the semiconductor substrate 100 where an active region is defined. The contact plugs 102 are formed through the insulation film 104 formed on the substrate 100. At this time, the contact plugs 102 are regularly positioned on the substrate 100.

Storage node electrodes 106a having a cylindrical shape are formed on the insulation film 104. The storage node electrodes 106a are electrically connected to the contact plugs 102. Bottom faces of the storage node electrodes 106a are open. A portion of the bottom face of each of the storage node electrodes 106a makes contact with an upper face of each of the contact plugs 102.

A dielectric film 110 and a plate electrode 112 are sequentially formed on the storage node electrodes 106a.

Hereinafter, a method for manufacturing the above-mentioned capacitor will be described.

FIG. 3A to FIG. 3E illustrate cross-sectional views depicting a method for manufacturing a capacitor according to the present embodiment.

Figure 3A:
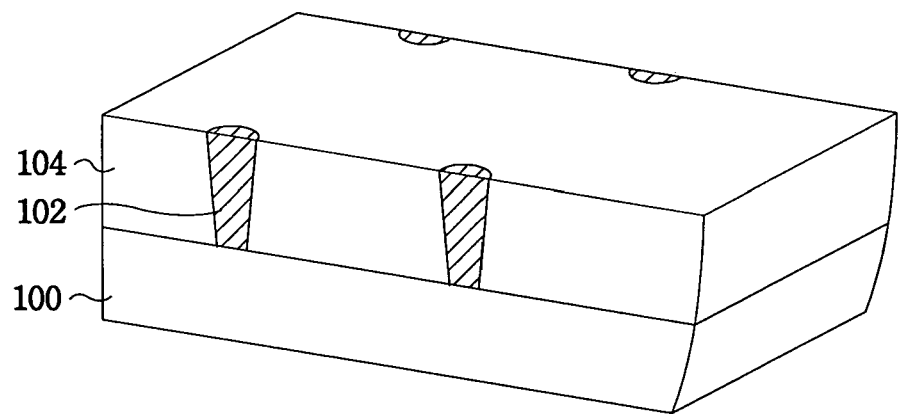
FIG. 3A to FIG. 3E illustrate cross-sectional views depicting a method for manufacturing a capacitor according to the first embodiment of the present invention.

FIG. 3A shows a step for forming an insulation film 104 including contact plugs 102 on a semiconductor substrate 100.

Referring to FIG. 3A, each of the contact plugs 102 makes electrical contact with a capacitor node contact region of the semiconductor substrate 100. The contact plugs 102 are regularly disposed on the semiconductor substrate 100.

The step for forming the insulation film 104 including the contact plugs 102 will be described as follows.

A field region and an active region are defined in the semiconductor substrate 100 by an isolation process. A semiconductor device may be positioned in the active region of the semiconductor substrate 100.

A device structure (not shown) including a capacitor node contact region is formed in the active region of the substrate 100. The device structure may include a metal oxide semiconductor (MOS) transistor and a bit line. Particularly, after a gate oxide film having a thin thickness is formed in the active region of the semiconductor substrate 100, a gate electrode having a polycide structure is formed on the gate oxide film. The gate electrodes may include a polysilicon film doped with impurities, and a tungsten silicide film. Then, source/drain regions of a transistor are formed at surface portions of the semiconductor substrate 100 by implanting impurities onto the substrate 100 using the gate electrode as a mask.

An interlayer dielectric film is formed on the semiconductor substrate 100 where the transistor is formed, and a bit line contact hole is formed by etching a predetermined portion of the interlayer dielectric film. A polysilicon film doped with impurities is formed to fill up the bit line contact hole, and a tungsten silicide film is formed on the polysilicon film. The polysilicon and tungsten silicide films are patterned using a photolithography process to provide a bit line having a polycide structure. The bit line may make contact with the source region of the transistor or a drain region of the transistor.

An insulation film is additionally formed on the semiconductor substrate 100 where the device structure is positioned. A predetermined portion of the insulation film is etched to form a contact hole that exposes the source region of the semiconductor substrate 100. At this time, the contact hole may have an upper portion wider than a bottom face thereof by etching the contact hole with a predetermined inclination. A conductive material fills the contact hole, and the insulation film is planarized by an etch back process to provide the insulation film 104 including the contact plugs 102.

Figure 3B:
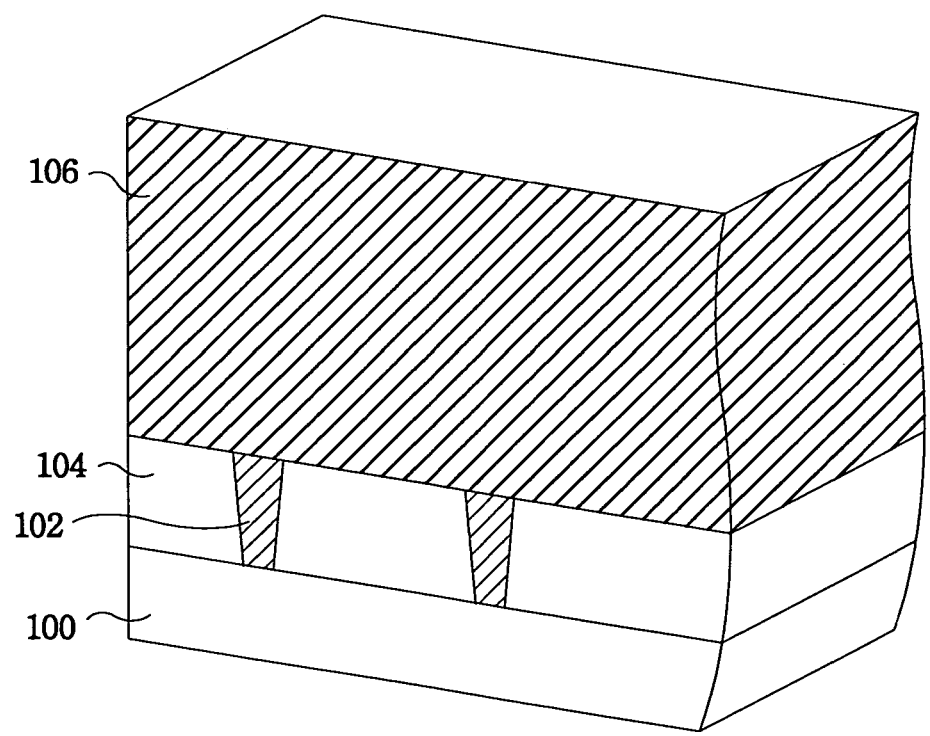

Referring to FIG. 3B, a polysilicon film 106 doped with impurities is formed on the insulation film 104 including the contact plugs 102. Because storage node electrodes are successively formed through the polysilicon film 106, the polysilicon film 106 is formed to have a predetermined height higher than heights of the storage node electrodes. Recently, a height of a storage node electrode has been increased to improve a storage capacitance of a capacitor. The storage node electrode generally has a height of about 7,000 to about 18,000 Å.

Figure 3C:
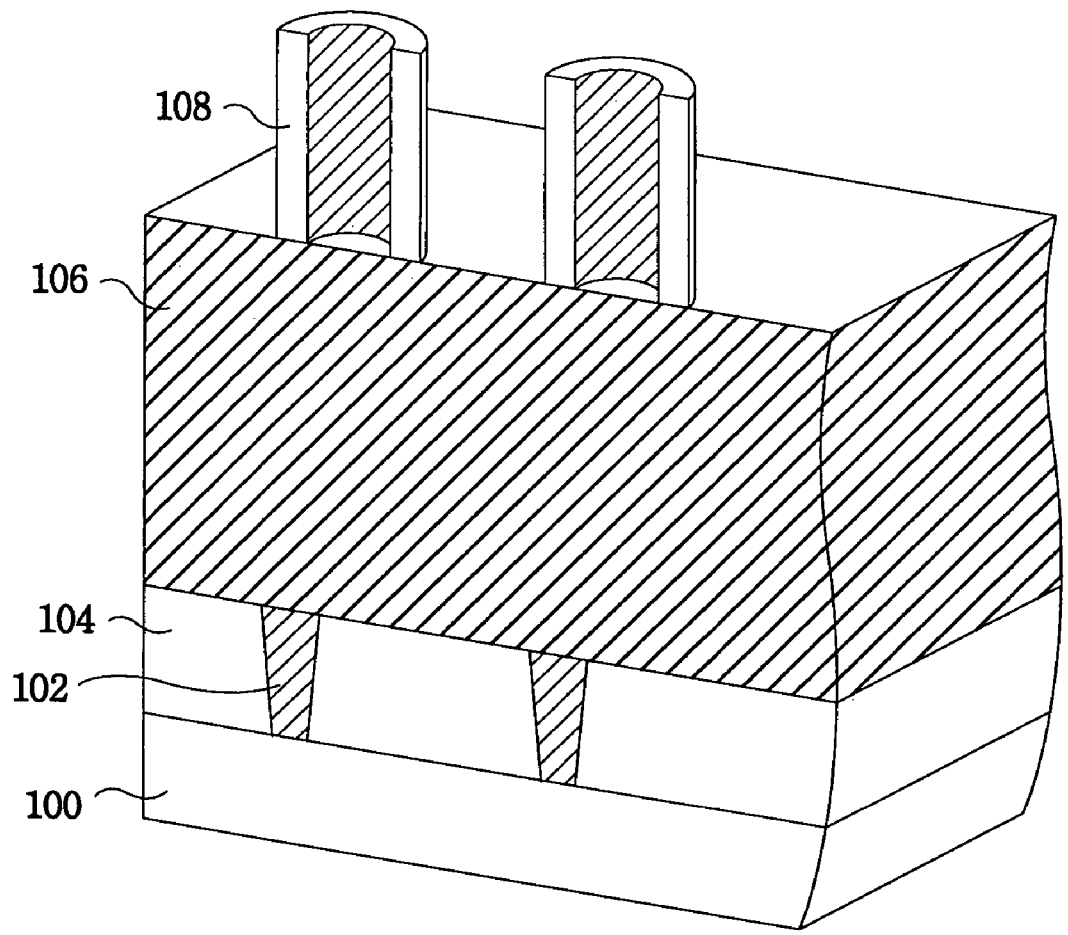

Referring to FIG. 3C, a mask (not shown) is disposed over a portion of the polysilicon film 106 under which the contact plugs 102 are positioned. Cylindrical photoresist patterns 108 are formed on the polysilicon film 106. In this case, both upper and lower faces of the photoresist patterns 108 are open.

Particularly, a photoresist film is coated on the polysilicon film 106. At this time, a thickness of the photoresist film may be determined by considering an etching selectivity of the photoresist film relative to the underlying polysilicon film 106. Namely, the photoresist film may have a sufficient thickness so that the photoresist film is not entirely consumed during a successive etching process in which the polysilicon film patterns are completely formed. For example, in a case that the polysilicon film 106 is about 7,000 Å thick, and an etching selectivity between the polysilicon film 106 and the photoresist film is about 2:1, the photoresist film preferably has a thickness of more than about 3,500 Å.

A phase shift mask is disposed over the photoresist film. The phase shift mask includes transmission regions regularly disposed therein and a blocking (partially blocking or partially transmitting) region enclosing the transmission regions. The transmission regions transmit a first light, and the blocking region transmits a second light having a phase angle that is the inverse of a phase angle of the first light. That is, the phase angle of the second light transmitted through the blocking region is shifted by 180° with respect to the phase angle of the first light. At this time, an intensity of the second light transmitted through the blocking region may be about 5 to about 50% of an intensity of the first light transmitted through the transmission regions.

Figure 4:
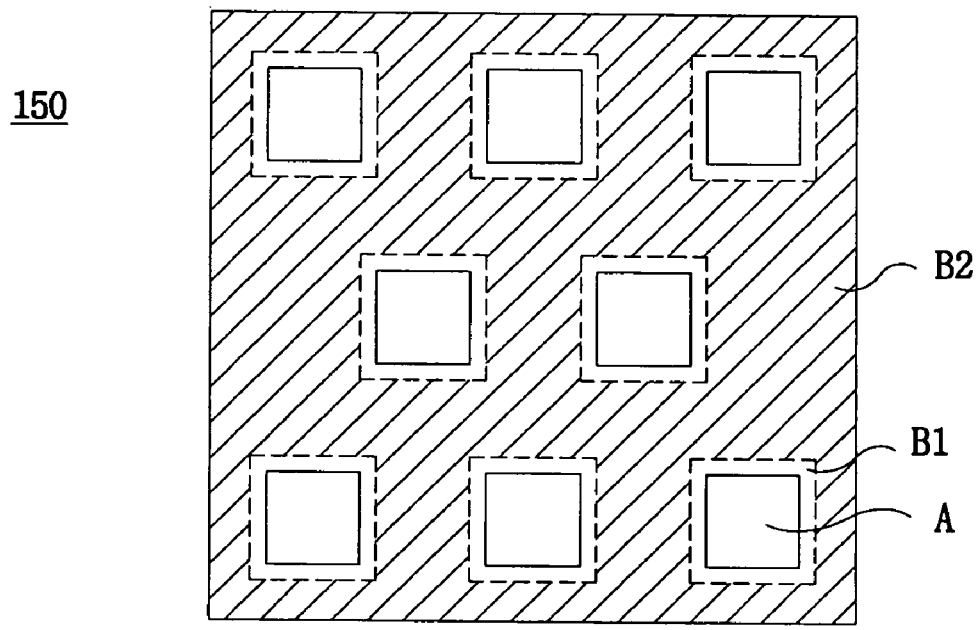
FIG. 4 illustrates a schematic plan view of a phase shift mask employed for photoresist patterns having cylindrical shapes according to a first embodiment of the present invention.
Figure 5:
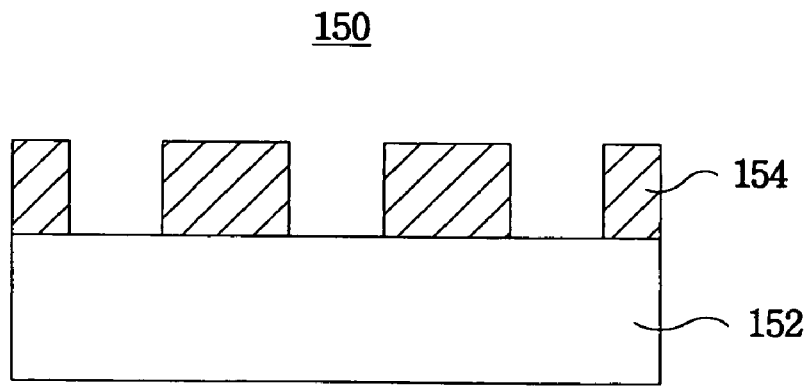
FIG. 5 illustrates a cross-sectional view of the phase shift mask in FIG. 4.

FIGS. 4 and 5 illustrate a plan view and a cross-sectional view, respectively, of the phase shift mask employed for the photoresist patterns having the cylindrical shapes.

Referring to FIGS. 4 and 5, a phase shift mask 150 has a lower film 152 and an upper film 154 positioned on the lower film 152. The lower film 152 preferably includes quartz and the upper film 154 preferably includes a phase shifting material, such as MoSiON. Portions of the upper film 154 corresponding to transmission regions A are etched to partially expose the lower film 152. The transmission regions A have a rectangular shape, and correspond to insides of the cylindrical photoresist patterns, respectively.

A light is irradiated onto the photoresist film while the phase shift mask 150 is disposed over the photoresist film.

Figure 6:
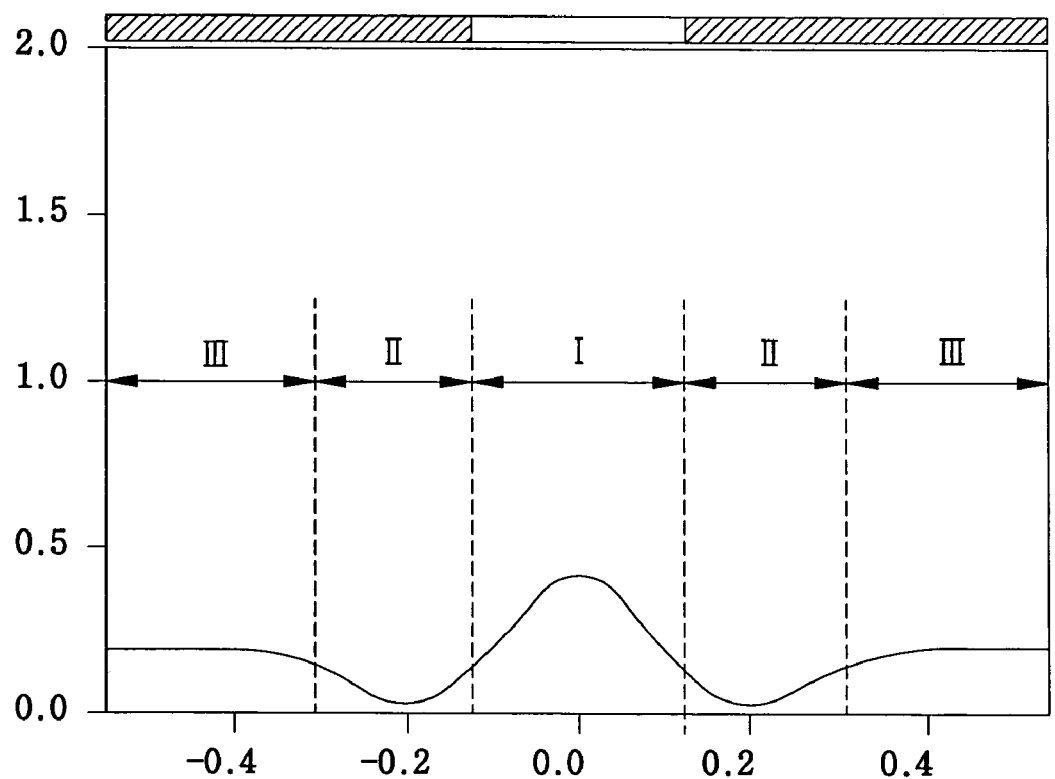
FIG. 6 is a graph illustrating intensity profiles of lights in a case that a phase shift mask includes one transmission region.

FIG. 6 is a graph illustrating intensity profiles of the light in a case that the phase shift mask 150 includes one transmission region I surrounded by a blocking region having a first portion II and a second portion III.

Referring to FIG. 6, the light intensity of the transmission region I of the phase shift mask 150 is a higher than a light intensity of any other region of the phase shift mask 150. Light beams having different phases interfere destructively with each other in the first portion of the blocking region II, which is adjacent to a peripheral portion of the transmission region I, because phase inversion of the light beams may occur between the transmission region I and the first portion of the blocking region II. Thus, the first portion of the blocking region II may have the lowest light intensity.

Meanwhile, a second portion of the blocking region III, which is near the first portion of the blocking region II adjacent to a peripheral portion of the transmission region I, may have a higher light intensity since an interfered light and a diffracted light of the light irradiated to transmission region I are permeated through the second portion of the blocking region II. As the intensity of the light transmitted through the second portion of the blocking region III becomes higher, parasite patterns may be formed causing a processing failure.

Figure 7:
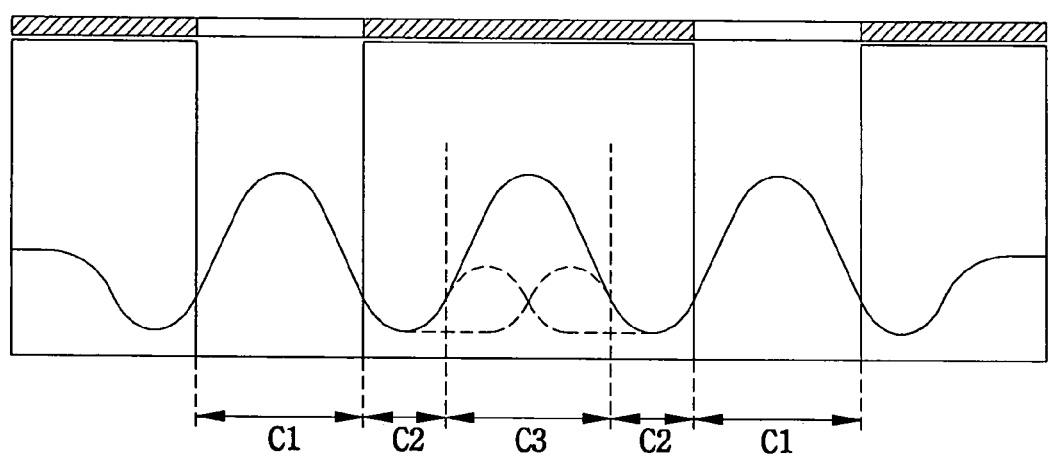
FIG. 7 is a graph illustrating intensity profiles of lights transmitting a phase shift mask having transmission regions regularly disposed therein.

FIG. 7 is a graph illustrating an intensity profile of light passing through a phase shift mask having transmission regions $C_1$ regularly disposed therein, surrounded by a blocking region having a first portion $C_2$ and a second portion $C_3$.

As shown in FIG. 7, when the transmission regions $C_1$ are arranged in the phase shift mask by a regular interval, interfered light and diffracted light of the light irradiated to the transmission regions $C_1$ are superposed at the second portion of the blocking region $C_3$ to cause constructive interference. Hence, the light intensity transmitted from the first portions of the blocking region $C_2$ to the second portion $C_3$, where the constructive interference occurs, may be increased to provide sufficient light for exposing the photoresist film.

Referring to FIG. 4 again, the phase shift mask 150 includes the rectangular shaped transmission regions A regularly disposed therein, surrounded by a blocking region including a first portion $B_1$ bordering the transmission regions A and a second portion $B_2$.

When an exposure process is performed using the phase shift mask 150, an intensity of light has a minimum value at the first portion of the blocking region $B_1$ adjacent to peripheral portions of the transmission regions A. The first portion of the blocking region $B_1$ may have a predetermined width along a boundary between the second portion of the blocking region $B_2$ and the transmission region A. Because the transmission regions A have a rectangular shape, the first portion of the blocking region $B_1$ having a lower light intensity has a ring shape. Light beams are sufficiently provided onto the regions A and $B_2$ to expose the photoresist film except for the ring shaped portion of the blocking region $B_1$. A width of the first portion of the blocking region $B_1$ having the ring shape may be desirably adjusted by controlling the intensity of light irradiated onto the phase shift mask 150. As a result, a width of the photoresist pattern may be adjusted, and the photoresist pattern may have a width of below about 100 nm (preferably 10 to 100 nm, more preferably 50 to 100 nm).

The first portion of the blocking region $B_1$ having the ring shape is located to mask the portions of the polysilicon film 106 positioned over the contact plugs 102. The transmission regions A of the phase shift mask 150 are not positioned directly over the underlying contact plugs 102, and a bottom face of the transmission regions A is adjacent to an upper face of each of the contact plugs 102.

Figure 3D:
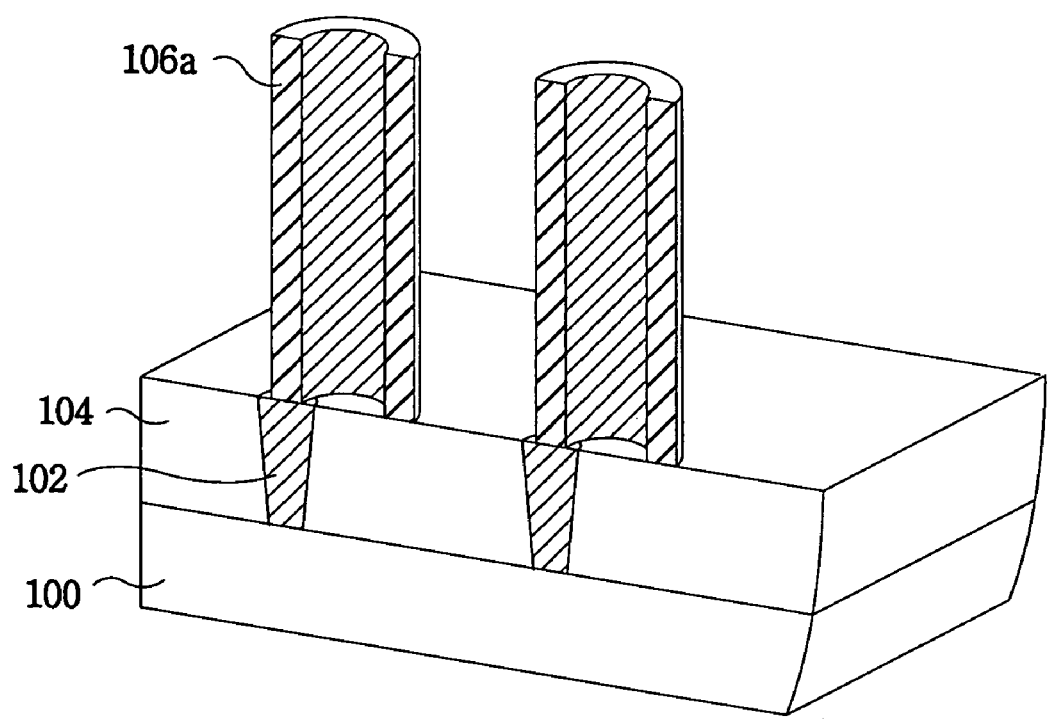

Referring now to FIG. 3D, storage nodes 106a of a capacitor are formed by etching the polysilicon film 106 of FIG. 3C using the cylindrical photoresist patterns 108 as etching masks until the insulation film 104 is exposed. With the etching process, the polysilicon film 106 is converted into polysilicon patterns 106a making contact with the underlying contact plugs 102. The polysilicon patterns 106a have open upper and lower faces, respectively. In addition, a portion of each of the polysilicon patterns 106a makes contact with each of the underlying contact plugs 102, respectively.

According to the method described above for manufacturing the capacitor, storage nodes can be formed by one etching process. Therefore, processes for separating storage nodes, depositing a sacrificial layer, planarizing the sacrificial layer, and removing an insulation film, for example, may be omitted in comparison with the conventional method for forming a capacitor.

Figure 3E:
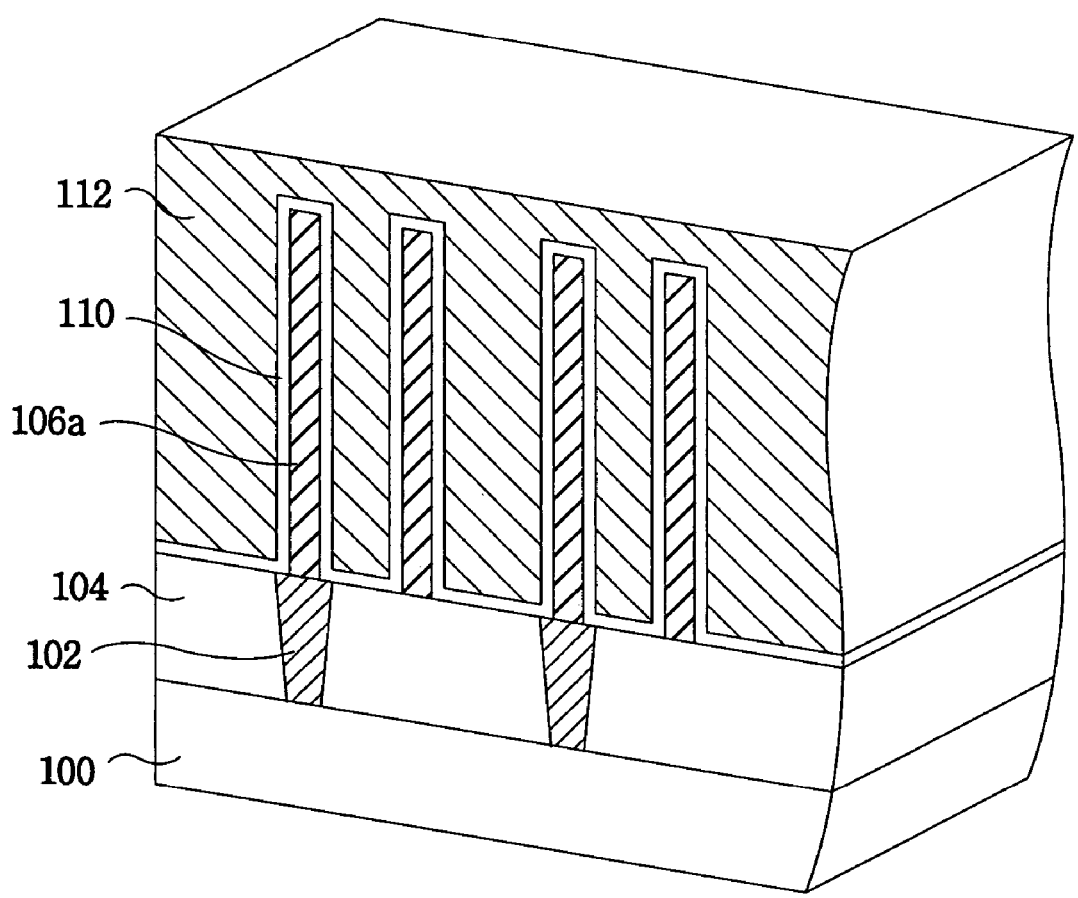

Referring FIG. 3E, a dielectric film 110 and a conductive film 112 for a plate electrode are successively formed on the storage nodes 106a, thereby completing the capacitor.

Embodiment 2

Figure 8:
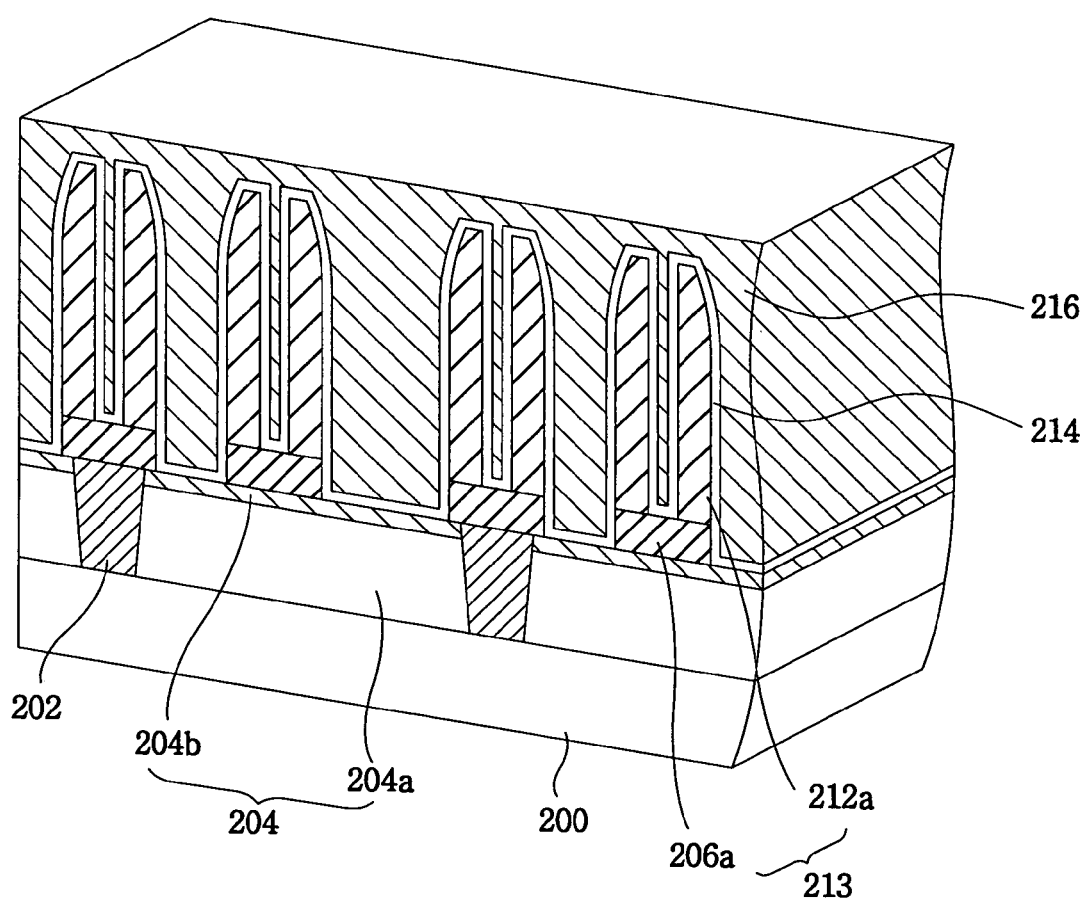
FIG. 8 illustrates a cross-sectional view of a capacitor according to a second embodiment of the present invention.

FIG. 8 illustrates a cross-sectional view of a capacitor according to a second embodiment of the present invention.

Referring to FIG. 8, an insulation film 204 including contact plugs 202 is formed on a semiconductor substrate 200. The insulation film 204 may include a composite film having an oxide film 204a and an etch stop film 204b sequentially formed on the oxide film 204a. The contact plugs 202 are regularly disposed on the semiconductor substrate 200.

Particularly, the insulation film 204 includes the contact plugs 202 electrically connected to a node contact region, for example, a source region of a transistor, of the semiconductor substrate 200 in which an active region is defined.

Ring-shaped pad polysilicon film patterns 206a electrically connected to the contact plugs 202 are formed on the contact plugs 202. A portion of each of the bottom faces of the ring-shaped pad polysilicon film patterns 206a makes contact with an upper portion of each of the contact plugs 202.

Spacer-shaped patterns 212a are formed on the ring-shaped patterns 206a. The spacer shaped patterns 212a make continuous contact with insides and outsides (inner and outer upper peripheral portions) of the ring-shaped patterns 206a. The spacer shaped patterns 212a are formed to extend vertically from the insides and outsides of the ring-shaped patterns 206a, thereby providing double cylindrical storage node electrodes 213.

A dielectric film 214 and plate electrodes 216 are sequentially formed on the storage node electrodes 213, respectively.

A method for manufacturing the capacitor having the above-described construction will be described as follows.

FIGS. 9A to 9I illustrate cross-sectional views depicting a method for manufacturing a capacitor according to the present embodiment.

Figure 9A:
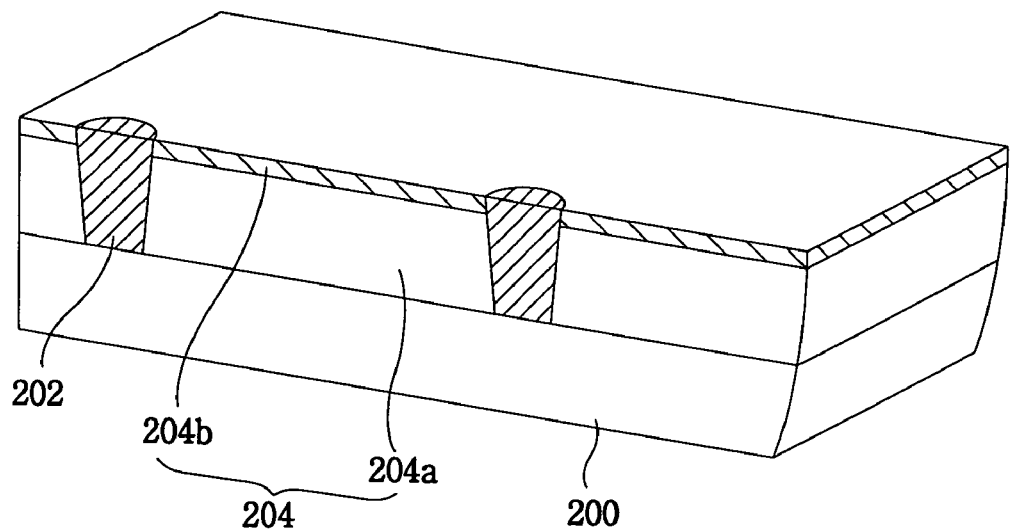
FIGS. 9A to 9I illustrate cross-sectional views depicting a method for manufacturing a capacitor according to a second embodiment of the present invention.

Referring to FIG. 9A, a first insulation film 204 including contact plugs 202 is formed on a semiconductor substrate 200. The contact plugs 202 are electrically connected to a capacitor node contact region of the semiconductor substrate 200. The first insulation film 204 may include a composite film having an oxide film 204a and an etch stop film 204b. Although it is not shown in the figures, the first insulation film 204 may include a composite film having an oxide film, an etch stop film and an additional oxide film. When an additional oxide film having a thin thickness is formed on the etch stop film, consumption of the etch stop film or generation of particles may be prevented during a successive etching process.

Hereinafter, the processes described above will be explained in detail.

The oxide film 204a and the etch stop film 204b are sequentially formed on the semiconductor substrate 200 where a device structure (not shown) is formed. Preferably, the etch stop film 204b includes silicon nitride that has a high etching selectivity relative to the oxide film 204a.

Predetermined portions of the etch stop and oxide films 204b and 204a are successively etched to provide contact holes exposing node contact regions of the semiconductor substrate 200, for example, source regions of a transistor. The contact holes are regularly formed on the semiconductor substrate 200.

In the etching process, upper portions of the contact holes may be wider than bottom portions of the contact holes by etching the etch stop and oxide films 204b and 204a with a predetermined inclination.

A conductive material is deposited to fill the contact holes, and an upper portion of the etch stop film 204b is planarized, thereby forming the first insulation film 204 including the contact plugs 202. The contact plugs 202 are regularly formed through the first insulation film 204.

Figure 9B:
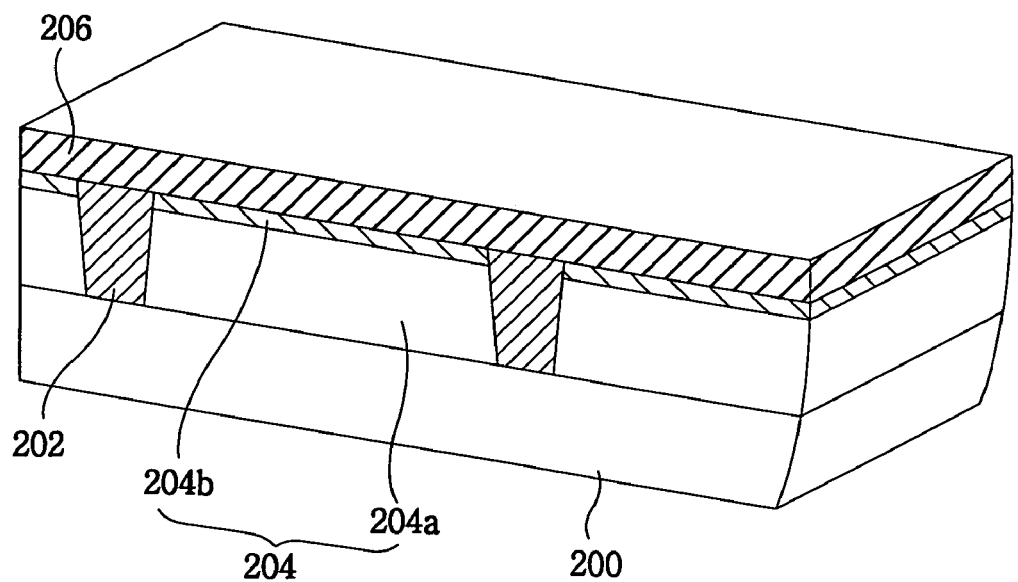

Referring to FIG. 9B, a first polysilicon film 206 doped with impurities is formed on the first insulation film 204 including the contact plugs 202. Later, the first polysilicon film 206 will serve as bottom face portions of storage node electrodes that are electrically connected to the contact plugs 202.

Figure 9C:
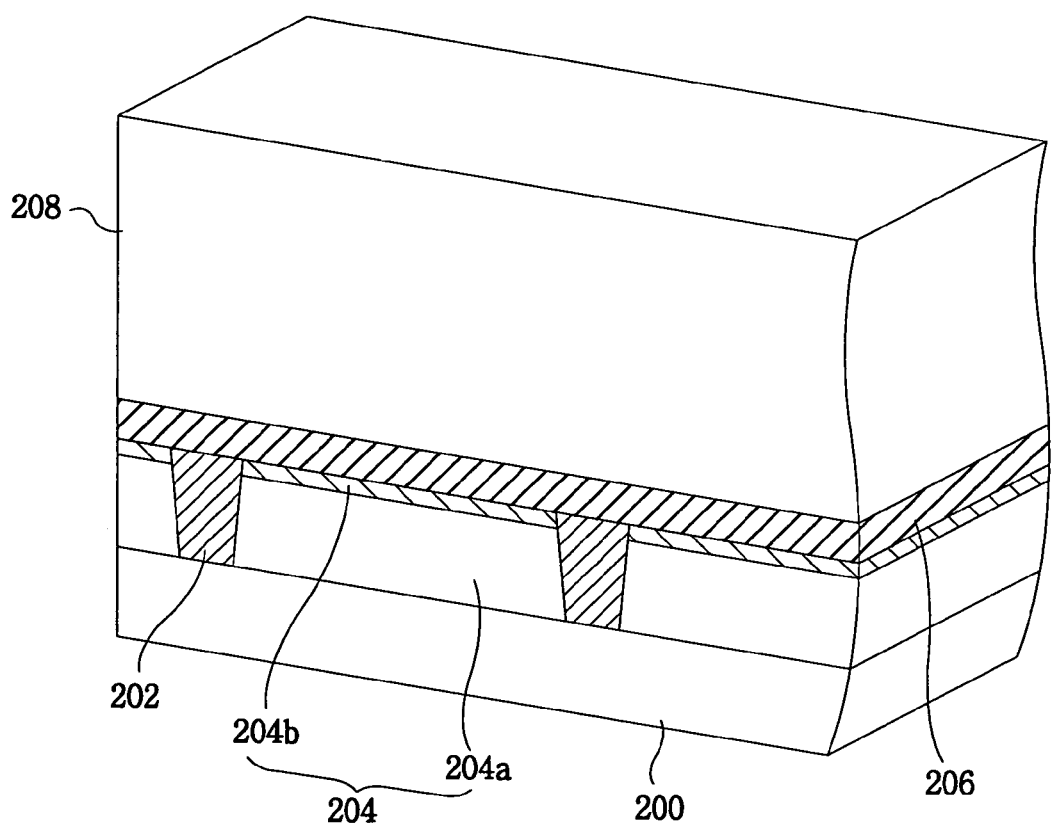

Referring to FIG. 9C, a second insulation film 208 is formed on the first polysilicon film 206. In this case, a height of the second insulation film 208 is higher than those of the storage node electrodes. Generally, heights of the storage node electrodes have been increased to increase a storage capacitance of a capacitor so that the storage electrode may have a height of about 7,000 to about 18,000 Å.

Figure 9D:
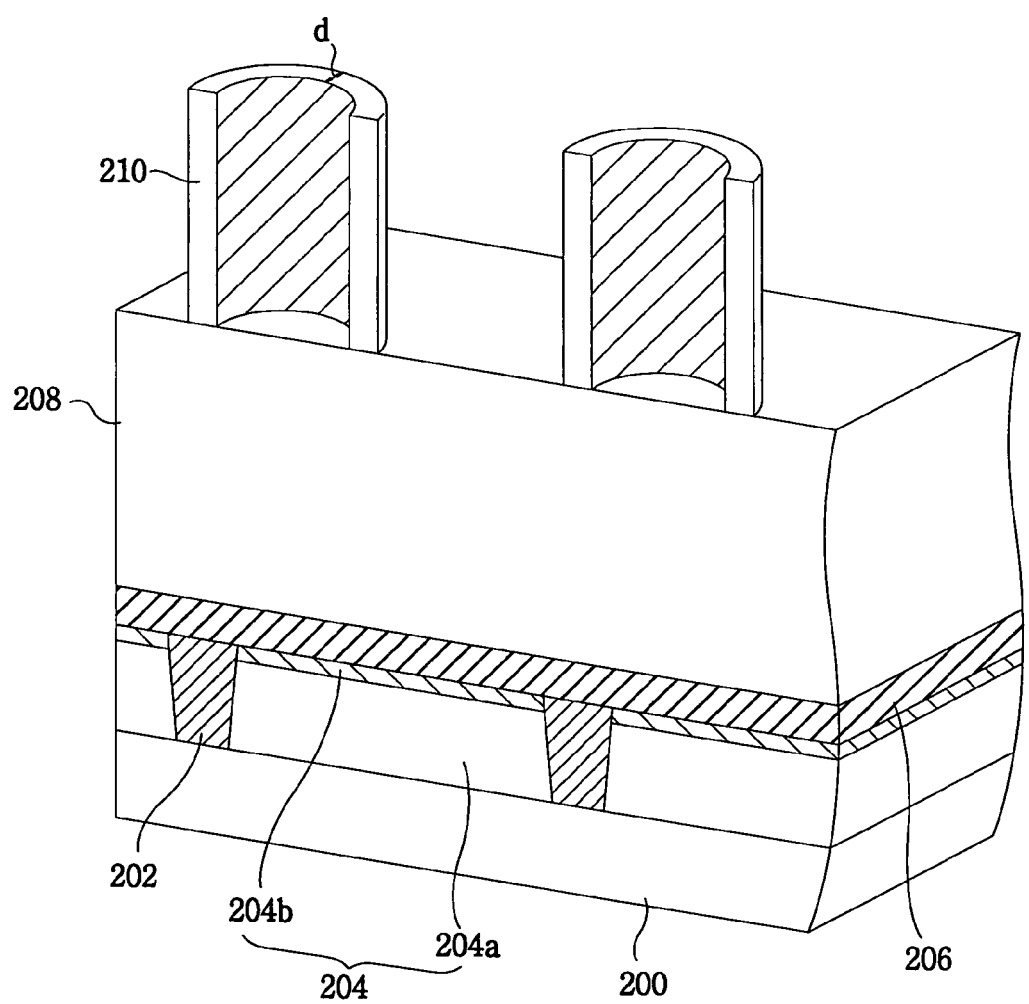

Referring to FIG. 9D, cylindrical photoresist patterns 210 are formed on the second insulation film 208 while portions of the second insulation film 208 over the contact plugs 202 are masked. Upper and bottom faces of the photoresist patterns 210 are open, and the photoresist patterns 210 have a width of d.

In the formation of the photoresist patterns, a photoresist film is coated on the second insulation film 208. A thickness of the photoresist film is determined in accordance with an etching selectivity between the photoresist film and the underlying second insulation film 208. Namely, the photoresist film is formed to have a sufficient thickness so that the photoresist patterns may not be entirely consumed until second insulation film patterns are completely formed during a successive etching process. For example, when a thickness of the second insulation film 208 is about 7,000 Å and an etching selectivity between the second insulation film 208 and the photoresist film is about 2:1, the photoresist film has a thickness of more than about 3,500 Å.

A phase shift mask identical to that of FIG. 4 is positioned over the photoresist film. The phase shift mask includes transmission regions regularly disposed therein and a blocking (partially blocking or partially transmitting) region enclosing the transmission regions. The transmission regions transmit a first light, and the blocking region transmits a second light having a phase angle inverted by about 180° concerning that of the first light. In this case, an intensity of the second light transmitted through the blocking region may be about 5 to about 50% of an intensity of the first light transmitted through the transmission regions.

Rectangular shaped transmission regions are regularly arranged in the phase shift mask. When a light is irradiated onto the phase shift mask, an intensity of the light is at a minimum at a portion of the blocking region located at a boundary between the transmission regions and the blocking region. The portion of the blocking region at the boundary of the transmission regions has a predetermined width and surrounds the transmission regions. The light intensity is at a minimum in the boundary region because light that is transmitted through the blocking region interferes destructively with the light that is transmitted through the transmission regions at the boundary region. This is because the light transmitted through the blocking region is inverted with respect to the light transmitted through the transmission regions, causing the light to "cancel." In the meantime, portions of the blocking region other than the portion at the boundary between the transmission and the blocking regions may have a slightly increased light intensity because interfered light and diffracted light of the light that is irradiated to the transmission regions are transmitted to the blocking region where they interfere constructively.

Since the transmission regions are regularly disposed in the phase shift mask, superposition between the interfered light and the diffracted light occurs to cause constructive interference at portions of the blocking region other than the boundary between the blocking region and the transmission regions. Therefore, light sufficient to expose the photoresist film may be provided at a portion of the blocking region where the constructive interference occurs, since the light intensity is increased in that region. As a result, solubility of the photoresist film varies at different portions of the blocking region. Meanwhile, the boundary portion of the blocking region having the minimum light intensity may have a ring shape since the transmission regions have a rectangular shape.

The ring shaped portions of the blocking region having the lowest light intensity are disposed over the second insulation film 208 to mask portions of the second insulation film 208 positioned over the contact plugs 202. The transmission regions of the phase shift mask are not positioned directly over the contact plugs 202 while bottom face portions of the transmission regions may be adjacent to the contact plugs 202. A width of the ring shaped portions of the blocking regions having the lowest light intensity may be adjusted by controlling the intensity of the light irradiated onto the phase shift mask, thereby adjusting the width of the photoresist pattern.

With an exposure process according to the above-described principle, a cylindrical photoresist pattern 210 is formed on the second insulation film 208 after a developing process is performed.

Figure 9E:
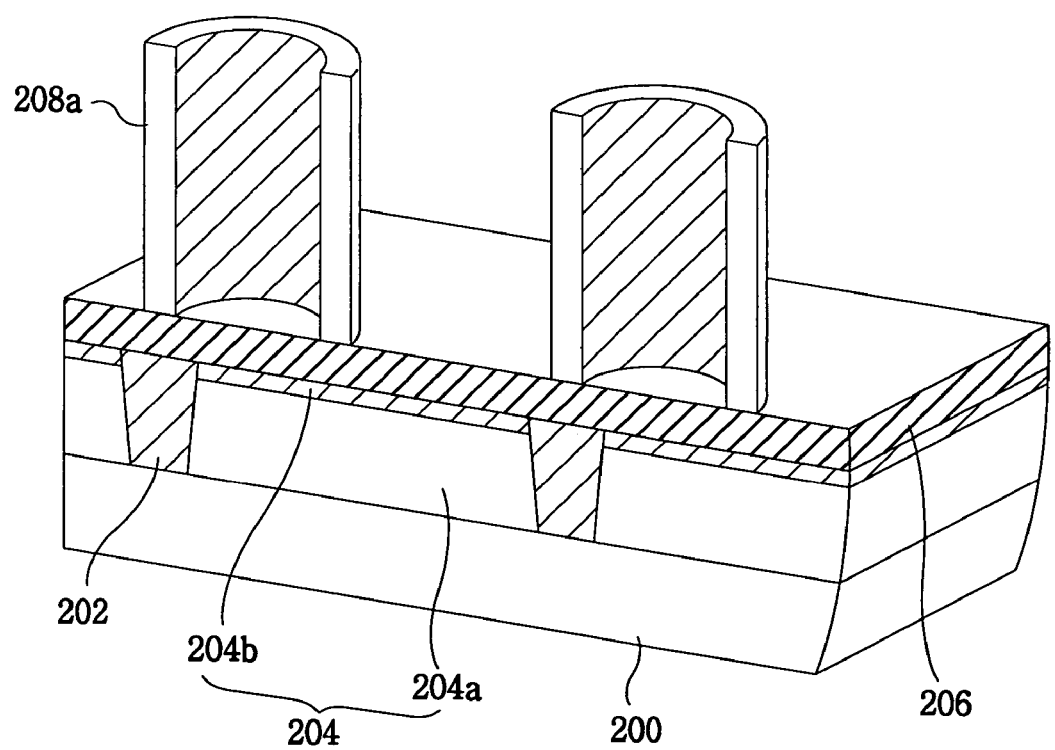

Referring to FIG. 9E, a cylindrical second insulation film pattern 208a is formed on the first polysilicon film 206 by etching the second insulation film 208 using the cylindrical photoresist pattern 210 as an etching mask until the first polysilicon film 206 is exposed. The second insulation film patterns 208a have open bottom faces, respectively. At this time, a portion of each of the bottom faces of the second insulation film patterns 208a is formed on the first polysilicon film 206 positioned over each of the contact plugs 202.

Figure 9F:
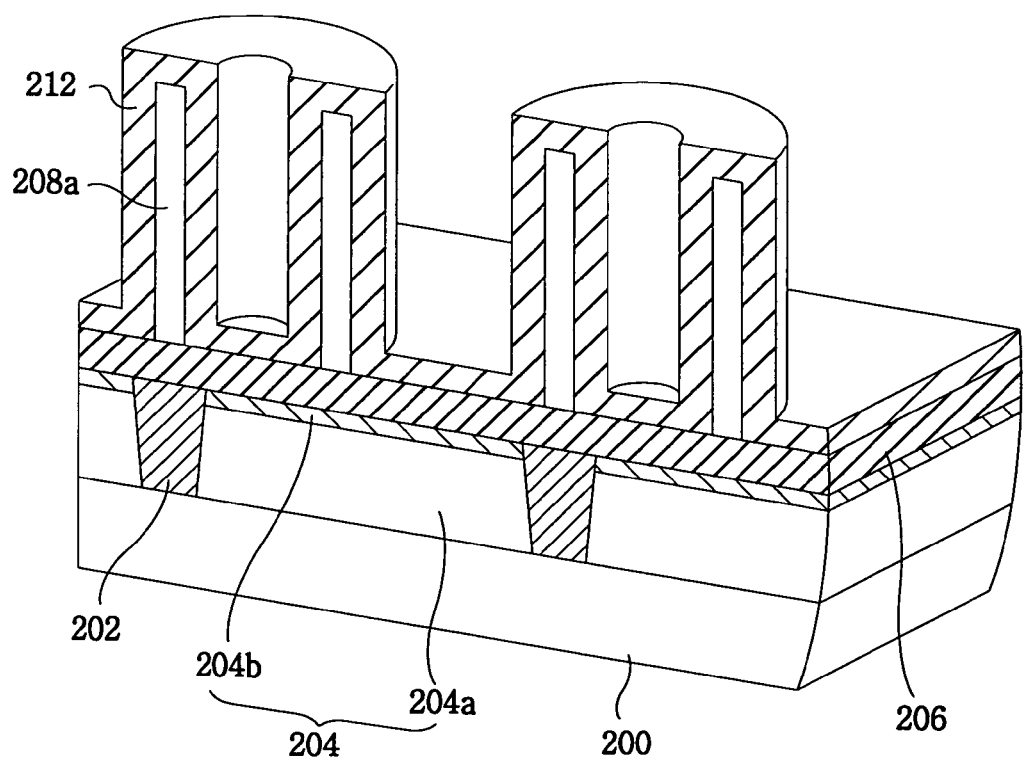

Referring to FIG. 9F, a second polysilicon film 212 is continuously formed on an exposed portion of the first polysilicon film 206, on sidewalls of the second insulation film patterns 208a, and on upper faces of the second insulation film patterns 208a. The second polysilicon film 212 has a thickness of about 500 to about 2,000 Å.

Figure 9G:
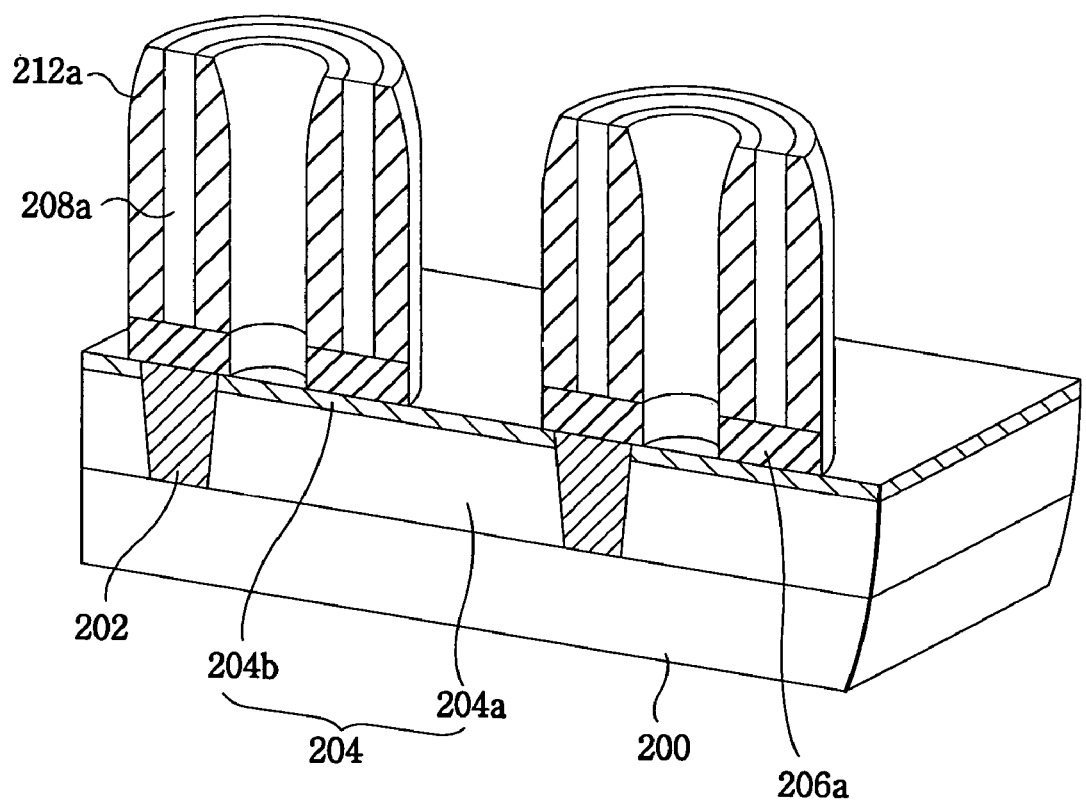

Referring to FIG. 9G, the second and first polysilicon films 212 and 206 are anisotropically etched so that portions 212a and 206a, respectively, of the second and first polysilicon films 212 and 206 remain at insides and outside the second insulation film patterns 208a, and beneath bottom faces of the second insulation film patterns 208a. When an anisotropic etching process is performed for the second and first polysilicon films 212 and 206, the first polysilicon film 206 is converted into a ring-shaped pattern 206a while the second polysilicon film 212 is changed into patterns 212a having shapes similar to sidewall spacers of the second insulation film patterns 208a. To form an isolated ring-shaped first polysilicon film pattern 206a without a connection between the adjacent ring-shaped patterns 206a, the second and first polysilicon films 212 and 206 are preferably over-etched.

Figure 9H:
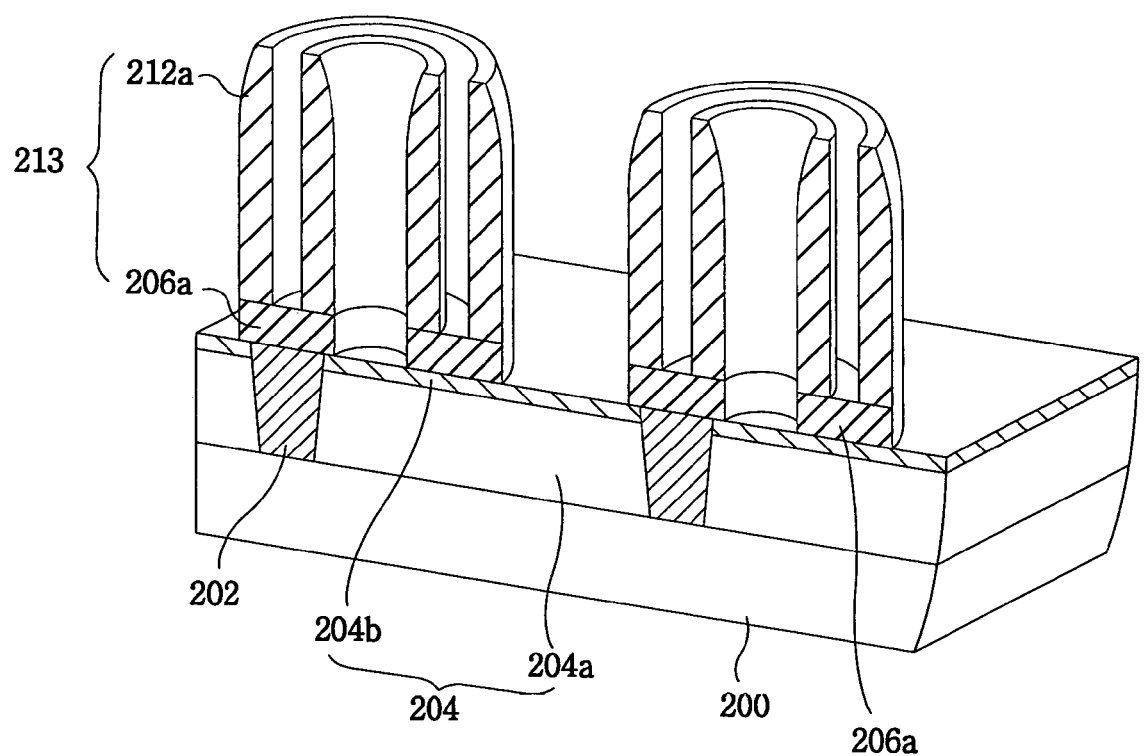

Referring to FIG. 9H, double cylindrical storage node electrodes 213 are formed by removing the remaining second insulation film patterns 208a.

Particularly, the second insulation film patterns 208a are anisotropically etched by immersing the resultant structure formed through the steps described in FIG. 9A and FIG. 9B in an etching solution. Because the etch stop film 204b is formed on the oxide film 204a, the oxide film 204a is not etched during etching the second insulation film patterns 208a. Thus, the double cylindrical storage node electrodes 213 can include the spacer-shaped patterns 212a that make continuous contact with insides and outsides (inner and outer upper peripheral portions) of the ring-shaped patterns 206a while the spacer-shaped patterns 212a extend vertically from the insides and outsides of the ring-shaped patterns 206a to provide the double cylindrical storage node electrodes 213.

Figure 9I:
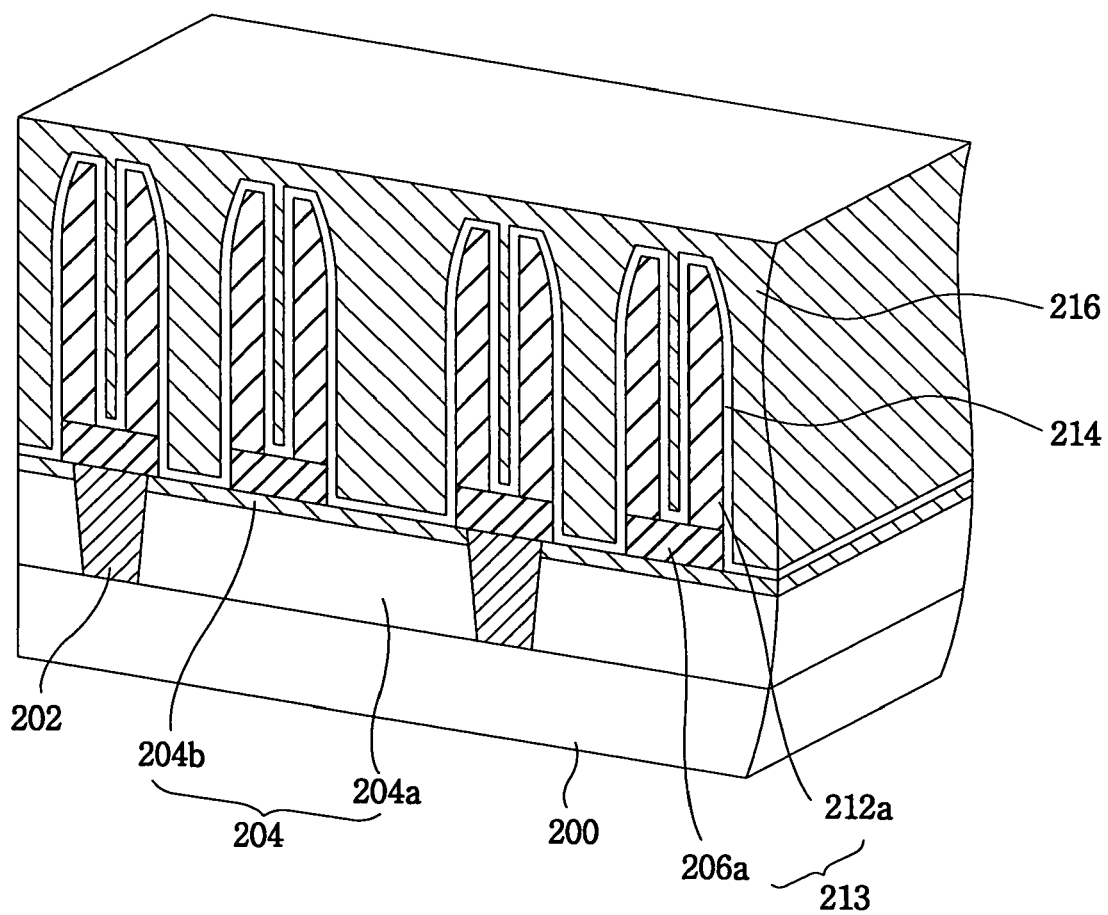

Referring to FIG. 9I, a capacitor is completed by successively forming dielectric films 214 and conductive films 216 for plate electrodes on the storage node electrodes 213, respectively.

Embodiment 3

Figure 10:
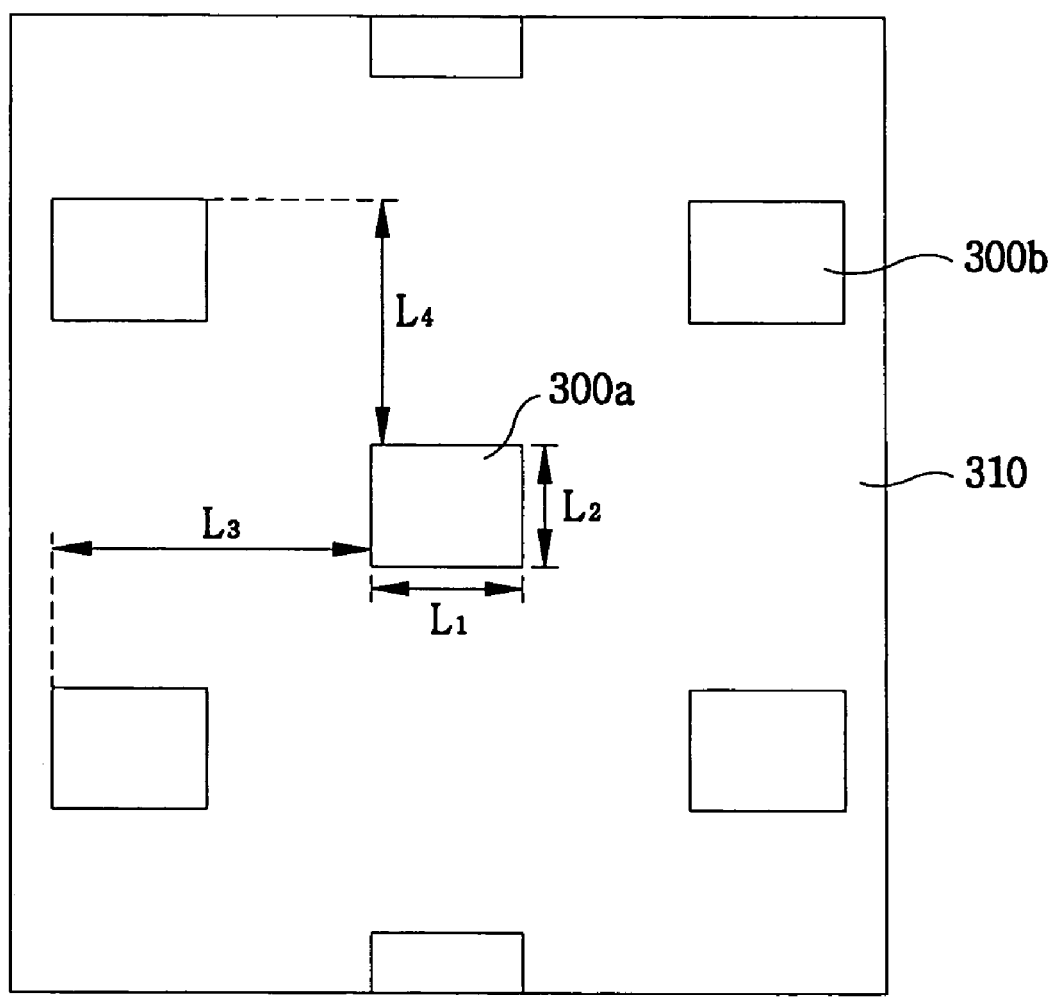
FIG. 10 illustrates a schematic plane view of a phase shift mask employed for cylindrical photoresist patterns according to a third embodiment of the present invention.

FIG. 10 illustrates a schematic plan view of a phase shift mask for cylindrical photoresist patterns according to a third embodiment of the present invention.

Referring FIG. 10, the phase shift mask includes first transmission regions 300a positioned along odd vertical lines and second transmission regions 300b disposed along even vertical lines. Positions of the first transmission regions 300a on a conventional X-axis of the phase shift mask are different from those of the second transmission regions 300. The first and second transmission regions 300a and 300b have rectangular shapes that have widths $L_1$ of about 250 nm and heights $L_2$ of about 200 nm. A first side of a transmission region is a distance $L_3$ from a first side of an adjacent transmission region in the X-direction and a first side of a transmission region is a distance $L_4$ from a first side of an adjacent transmission region in a conventional Y-direction. Distance $L_3$ is about 500 nm and distance $L_4$ is about 400 nm.

Figure 11:
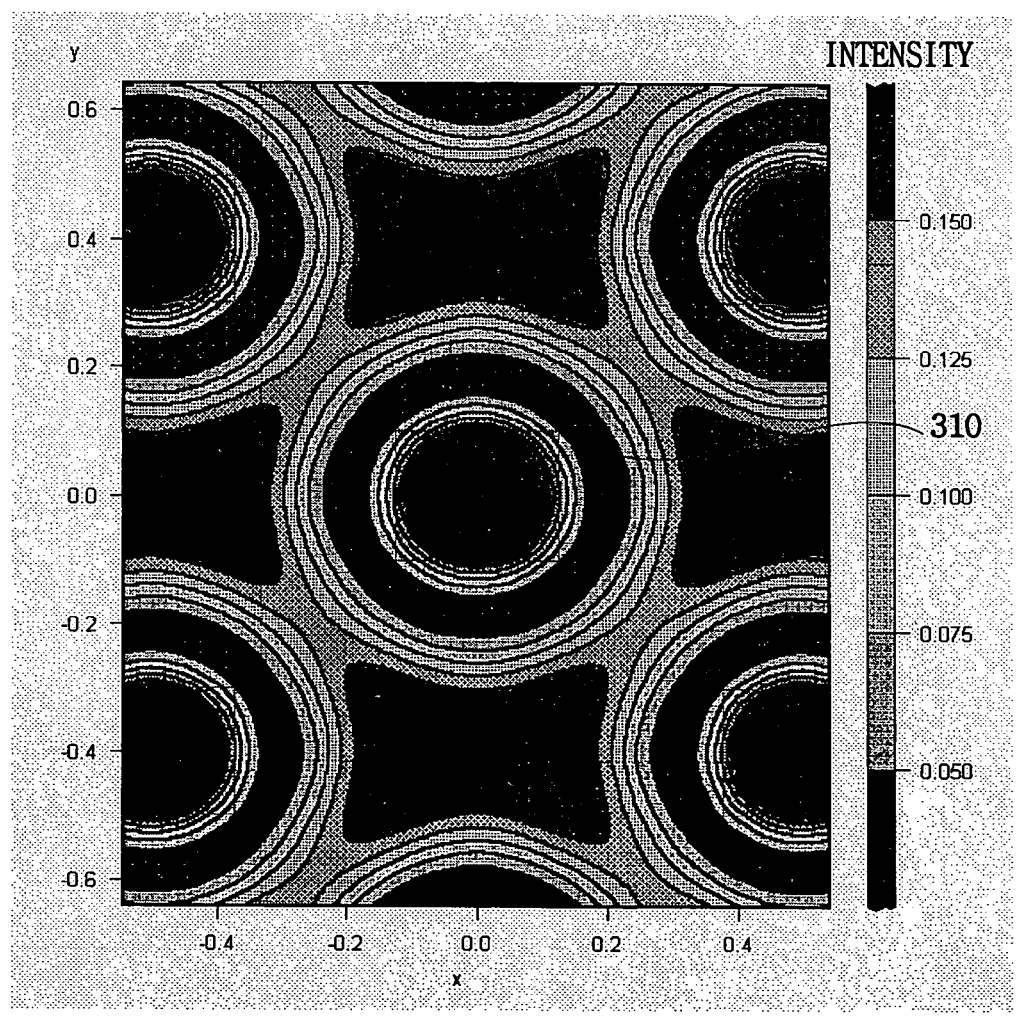
FIG. 11 illustrates a simulation picture of light intensity profiles obtained by employing the phase shift mask of FIG. 10.

FIG. 11 illustrates a simulation picture of a light intensity profile obtained by employing the phase shift mask in FIG. 10.

In FIG. 11, conditions of a simulation for the light intensity profiles are as follows:

a transmission rate in an inversion region (boundary region) of the phase shift mask of about 20%;

an optical system having an NA of about 0.6, a σ of about 0.4, and a conventional diameter, where σ and NA equal, respectively, the partial coherence and numerical aperture of the exposure tool; and an exposure amount of about 65 mJ/cm²sec.

In this case, an intensity of light shows the lowest value at a portion of a blocking region 310 adjacent to a boundary between the transmission region and the blocking region because light having different phases interferes destructively at the boundary. Portions of the blocking region 310 other than that at the boundary of the transmission and blocking regions, have a light intensity similar to that of the transmission regions 300a and 300b. This is because diffracted light of the light irradiated to the transmission regions 300a and 300b interferes with light transmitted through other portions of the blocking region. Therefore, cylindrical photoresist patterns may be formed using the phase shift mask under the above-mentioned conditions.

Figure 12:
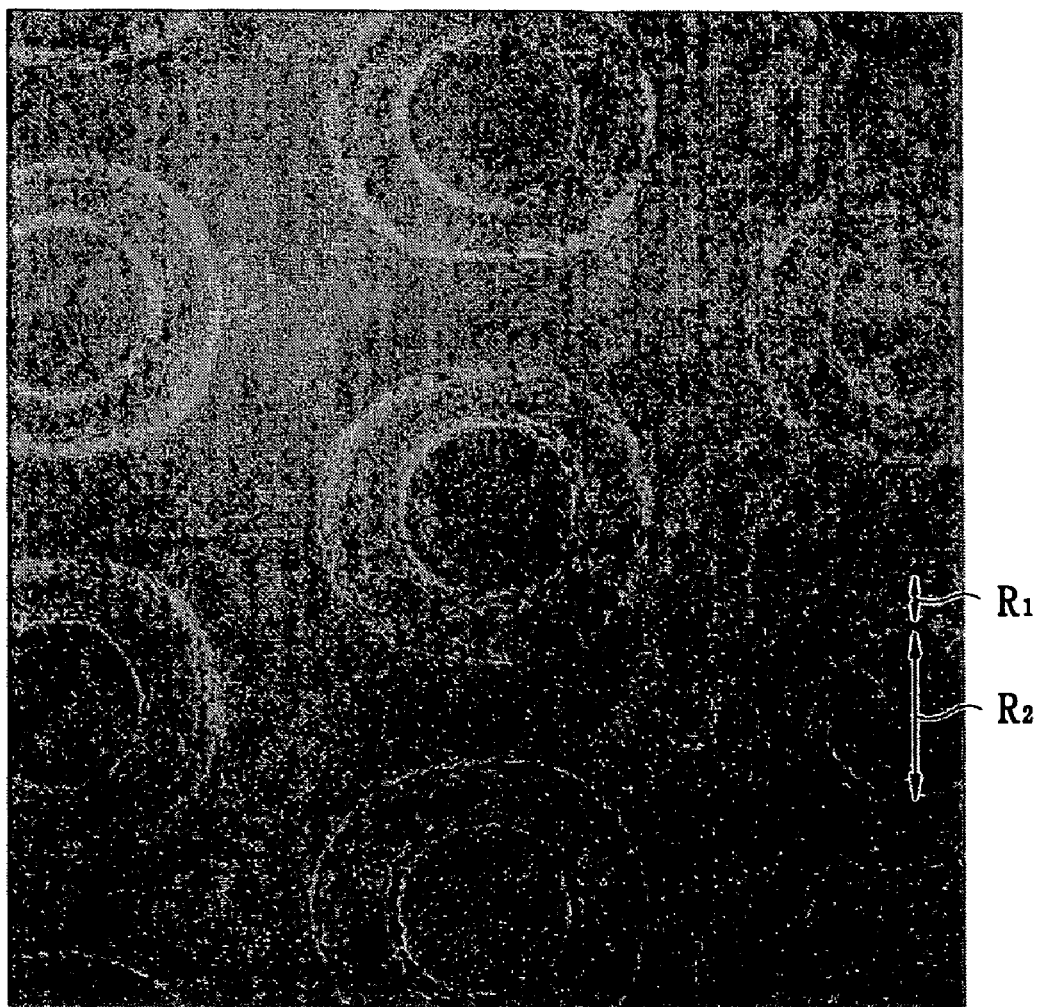
FIG. 12 illustrates a plan picture of photoresist patterns formed by exposing a photoresist film with the phase shift mask of FIG. 10.

FIG. 12 illustrates a plan view of photoresist patterns formed by exposing a photoresist film with the phase shift mask of FIG. 10.

The photoresist patterns in FIG. 12 are formed as follows.

An oxide film having a thickness of about 1,000 Å and a nitride film having a thickness of about 300 Å are formed on a substrate. The nitride film functions as an anti-reflection layer. A photoresist film having a thickness of about 7,000 Å is formed on the nitride film. The photoresist film is exposed using the phase shift mask as shown in FIG. 10.

Exposure conditions of an exposure process for the photoresist film are as follows:

a transmission rate in an inversion region of the phase shift mask is about 20%;

an optical system having an NA of about 0.6, a σ of about 0.4, a conventional diameter; and an exposure amount of about 65 mJ/cm²sec.

With the above-mentioned exposure conditions, the photoresist patterns may have a cylindrical shape. The cylindrical photoresist patterns have a ring shape. In addition, widths $R_1$ of the ring-shaped photoresist patterns are about 70 nm, and inner diameters $R_2$ of inner circle of cylindrical photoresist patterns are about 220 nm.

Embodiment 4

Figure 13:
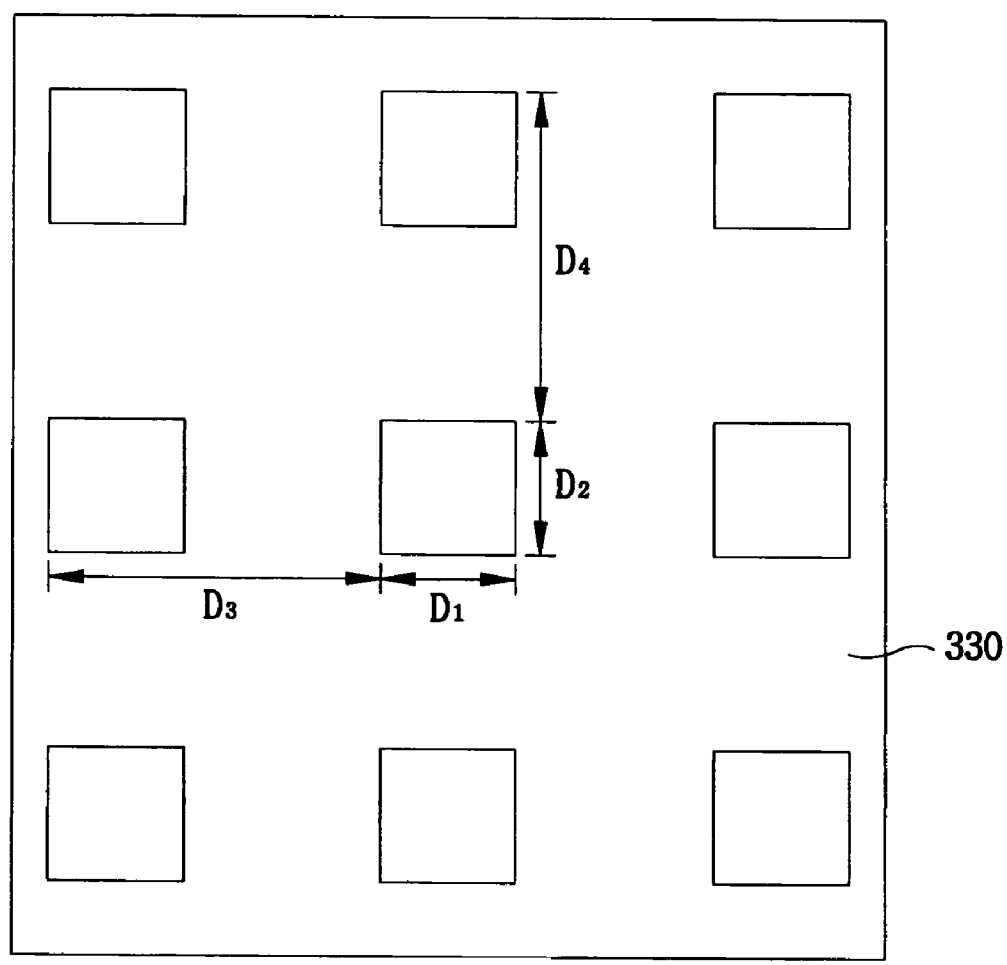
FIG. 13 illustrates a schematic plan view of a phase shift mask for cylindrical photoresist patterns according to a fourth embodiment of the present invention.

FIG. 13 illustrates a schematic plan view of a phase shift mask for cylindrical photoresist patterns according to a fourth embodiment of the present invention.

Ah shown in FIG. 13, a phase shift mask includes first transmission regions disposed along odd lines and second transmission regions positioned along even lines. The positions of the first transmission regions on an X-axis of the phase shift mask are identical to those of the second transmission regions on the X-axis. The transmission regions have a rectangular shape in which widths $D_1$ of the transmission regions are about 180 nm and heights $D_2$ of the transmission regions are about 180 nm. As for the transmission regions, intervals $D_3$ between adjacent transmission regions along the X-axis are about 450 nm, and intervals $D_4$ between adjacent transmission regions along a Y-axis of the phase shift mask are about 450 nm centering about central points of the transmission regions adjacent to each other.

Figure 14:
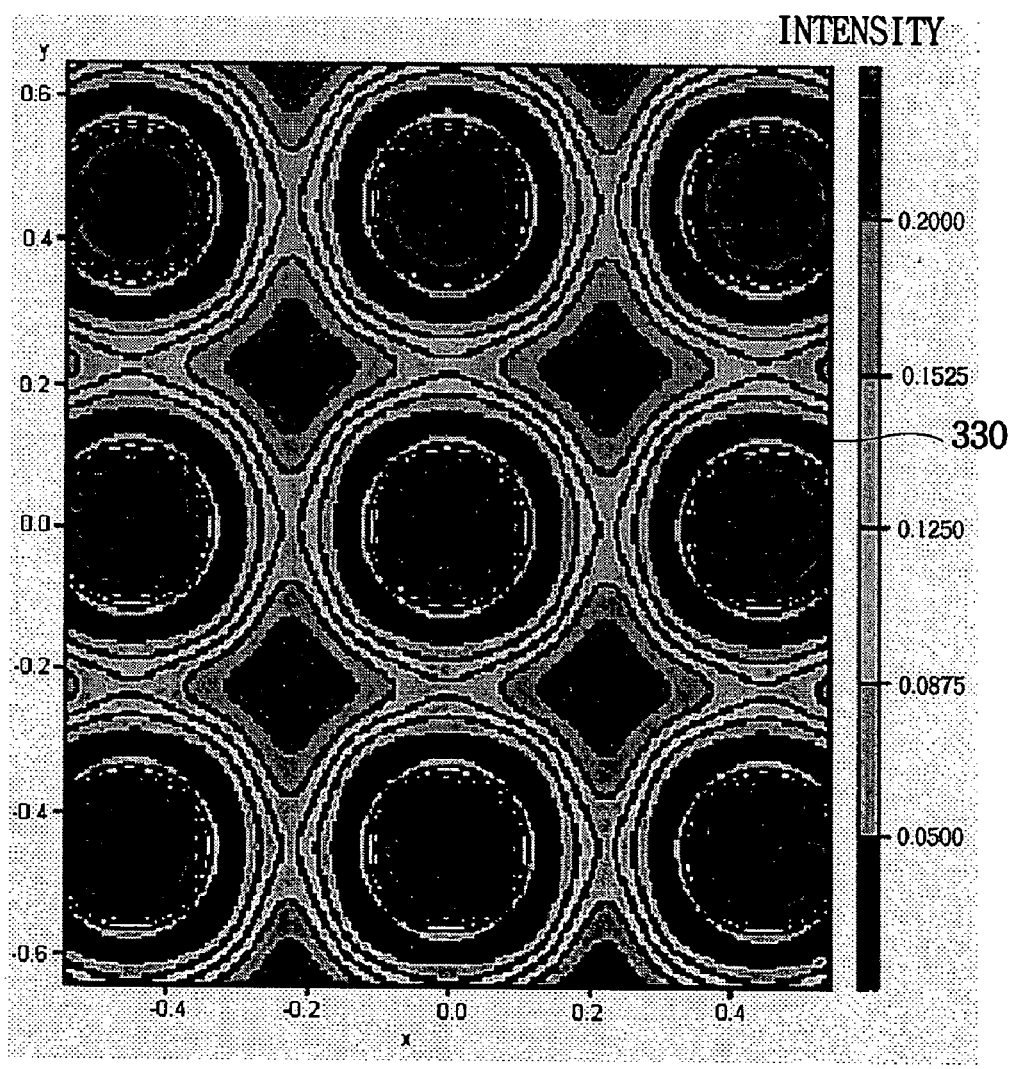
FIG. 14 illustrates a simulation picture of light intensity profiles obtained by employing the phase shift mask of FIG. 13.

FIG. 14 illustrates a simulation picture of light intensity profiles obtained by employing the phase shift mask as shown in FIG. 13.

In FIG. 14, conditions of a simulation for the light intensity profiles are as follows:

a transmission rate in an inversion region of the phase shift mask of about 20%;

an optical system having an NA of about=0.8, a σ of about 0.3, and a conventional diameter; and an exposure amount of about 65 mJ/cm²sec.

In this case, light intensity is at a minimum at a boundary portion of a blocking region 330 of the phase shift mask adjacent to a boundary between the transmission region and the blocking region 330 because light having different phases interfere destructively with each other in that region. Portions of the blocking region 330 other than the portion at the boundary between the blocking region and the transmission regions have a light intensity that is similar to the light intensity of the transmission regions. This is because diffracted light of light that is irradiated onto the transmission regions interferes with the lights that are transmitted through the other portions of the blocking region 330. Therefore, since the transmission regions have a rectangular shape, cylindrical photoresist patterns may be formed by employing the phase shift mask under the above-mentioned conditions.

As described above, according to the present invention, manufacturing processes for a semiconductor device may be simplified by employing photoresist patterns having cylindrical shapes.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method for forming a capacitor, comprising:
   forming an insulation film including a contact plug on a semiconductor substrate, an exposed upper portion of the contact plug being wider than a lower portion of the contact plug;
   forming a conductive film on the insulation film;
   forming a hollow cylindrical photoresist pattern on the conductive film, the hollow cylindrical photoresist pattern masking a portion of the conductive film positioned over the contact plug; and
   forming a hollow cylindrical conductive film pattern by etching the conductive film using the hollow cylindrical photoresist pattern as an etching mask until the insulation film is exposed, wherein the hollow cylindrical conductive film pattern makes electrical contact with the contact plugs.

2. The method as claimed in claim 1, wherein the hollow cylindrical photoresist pattern is formed by:
   coating a photoresist film on the conductive film;
   exposing the photoresist film by irradiating a light onto a selected potion of the photoresist film and by transmitting an interfered light of the irradiated light onto a remaining portion of the photoresist film except a ring-shaped portion of the photoresist film having a predetermined width along a boundary of the selected portion, wherein a portion of the conductive film corresponding to the contact plug is positioned beneath the ring-shaped portion; and
   developing the exposed photoresist film to provide the hollow cylindrical photoresist pattern.

3. The method as claimed in claim 2, wherein the photoresist film is exposed by the light irradiated onto the selected portions, and a transmitting light irradiated onto the portion except the selected portion, the transmitting light having an inverted phase of the light irradiated onto the selected portion.

4. The method as claimed in claim 3, wherein a first interfered light generated from a first light irradiated onto a first selected portion is superposed with interfered lights generated from the light irradiated onto the selected portions adjacent to the first selected portion to increase intensities of the light exposing the photoresist film.

5. The method as claimed in claim 3, wherein a width of the ring-shaped portion is adjusted by an intensity of the light irradiated onto the selected portion.

6. The method as claimed in claim 2, wherein an intensity of a transmitting light irradiated onto the photoresist film other than the selected portion is about 15% to about 50% that of the light irradiated onto the selected portion.

7. The method as claimed in claim 2, wherein the selected portion includes regularly disposed regions of the photoresist film.

* * * * *